United States Patent
Takeda

(10) Patent No.: US 9,922,821 B2
(45) Date of Patent: Mar. 20, 2018

(54) METHOD OF MANUFACTURING SEMICONDUCTOR DEVICE, USING HYDROCARBON AND HALOGEN-BASED PRECURSORS, SUBSTRATE PROCESSING APPARATUS FOR PROCESSING SAME, AND RECORDING MEDIUM COMPRISING HYDROCARBON AND HALOGEN-BASED PRECURSORS

(71) Applicant: Hitachi Kokusai Electric Inc., Tokyo (JP)

(72) Inventor: Tsuyoshi Takeda, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days.

(21) Appl. No.: 14/671,504

(22) Filed: Mar. 27, 2015

(65) Prior Publication Data
US 2015/0303051 A1  Oct. 22, 2015

(30) Foreign Application Priority Data
Apr. 17, 2014  (JP) ................. 2014-085652

(51) Int. Cl.
*H01L 21/20* (2006.01)
*H01L 21/36* (2006.01)
(Continued)

(52) U.S. Cl.
CPC .......... *H01L 21/0228* (2013.01); *C23C 16/24* (2013.01); *C23C 16/42* (2013.01); *C23C 16/4412* (2013.01); *C23C 16/45523* (2013.01); *C23C 16/45557* (2013.01); *C23C 16/52* (2013.01); *H01L 21/0217* (2013.01); *H01L 21/0262* (2013.01); *H01L 21/02126* (2013.01); *H01L 21/02211* (2013.01); *H01L 21/02529* (2013.01); *H01L 21/02532* (2013.01); *H01L 21/02579* (2013.01); *H01L 21/28556* (2013.01);
(Continued)

(58) Field of Classification Search
CPC ........... H01L 21/02263; H01L 21/0228; C23C 16/325
USPC ................................... 438/758, 478
See application file for complete search history.

(56) References Cited

U.S. PATENT DOCUMENTS 5,248,348 A * 9/1993 Miyachi ................ H01L 31/075 136/258
5,319,220 A * 6/1994 Suzuki ................ H01L 29/1608 257/103
(Continued)

FOREIGN PATENT DOCUMENTS

JP  2013-102130 A  5/2013

*Primary Examiner* — Lex Malsawma
*Assistant Examiner* — Eric W Jones
(74) *Attorney, Agent, or Firm* — Volpe and Koenig, P.C.

(57) ABSTRACT

Provided is a technique of forming a film containing a first element and a second element on a substrate by performing a cycle a predetermined number of times. The cycle includes: (a) supplying a hydro-based precursor containing the first element and a halogen-based precursor containing the second element into a process chamber accommodating a substrate to confine the hydro-based precursor and the halogen-based precursor in the process chamber; (b) maintaining a state where the hydro-based precursor and the halogen-based precursor are confined in the process chamber; and (c) exhausting the process chamber.

18 Claims, 9 Drawing Sheets

(51) Int. Cl.
  *H01L 21/02* (2006.01)
  *H01L 21/285* (2006.01)
  *C23C 16/44* (2006.01)
  *C23C 16/52* (2006.01)
  *C23C 16/455* (2006.01)
  *C23C 16/24* (2006.01)
  *C23C 16/42* (2006.01)
  *H01L 21/3205* (2006.01)

(52) U.S. Cl.
  CPC .. *H01L 21/32051* (2013.01); *H01L 21/32053* (2013.01)

(56) References Cited

U.S. PATENT DOCUMENTS

| | | | | |
|---|---|---|---|---|
| 5,646,050 | A * | 7/1997 | Li | H01L 31/03767 136/258 |
| 5,709,745 | A * | 1/1998 | Larkin | C30B 25/02 117/96 |
| 5,871,805 | A * | 2/1999 | Lemelson | C23C 16/52 427/10 |
| 6,056,824 | A * | 5/2000 | Bartholomew | C23C 16/4401 118/715 |
| 6,306,211 | B1 * | 10/2001 | Takahashi | C30B 25/02 117/102 |
| 6,352,592 | B1 * | 3/2002 | Bartholomew | C23C 16/4401 118/715 |
| 8,846,546 | B2 | 9/2014 | Takeda | |
| 2002/0016084 | A1 * | 2/2002 | Todd | C23C 16/30 438/791 |
| 2003/0049388 | A1 * | 3/2003 | Cho | C23C 16/325 427/569 |
| 2003/0094135 | A1 * | 5/2003 | Komiya | C23C 16/4412 118/715 |
| 2004/0151845 | A1 * | 8/2004 | Nguyen | C23C 16/56 427/569 |
| 2004/0191966 | A1 * | 9/2004 | Izumi | C23C 16/0218 438/149 |
| 2004/0266057 | A1 * | 12/2004 | Nagasawa | C30B 25/02 438/105 |
| 2008/0207007 | A1 * | 8/2008 | Thridandam | C23C 16/401 438/778 |
| 2009/0087579 | A1 * | 4/2009 | Hautala | C23C 14/221 427/527 |
| 2010/0166955 | A1 * | 7/2010 | Becker | C23C 16/4401 427/248.1 |
| 2010/0327281 | A1 * | 12/2010 | Nakajima | H01L 29/04 257/57 |
| 2011/0065289 | A1 * | 3/2011 | Asai | C23C 16/345 438/791 |
| 2011/0177677 | A1 * | 7/2011 | Ku | C23C 16/407 438/478 |
| 2011/0262642 | A1 * | 10/2011 | Xiao | C07F 7/025 427/255.394 |
| 2012/0021138 | A1 * | 1/2012 | Ditizio | C23C 16/409 427/539 |
| 2012/0321779 | A1 * | 12/2012 | Vargas | C23C 16/045 427/2.26 |
| 2013/0014810 | A1 * | 1/2013 | Yamaoka | H01L 31/076 136/252 |
| 2013/0049014 | A1 * | 2/2013 | Aigo | C30B 25/02 257/77 |
| 2013/0224665 | A1 * | 8/2013 | Wu | G03F 7/16 430/324 |
| 2013/0280921 | A1 * | 10/2013 | Takeda | H01L 21/02115 438/781 |

* cited by examiner

METHOD OF MANUFACTURING SEMICONDUCTOR DEVICE, USING HYDROCARBON AND HALOGEN-BASED PRECURSORS, SUBSTRATE PROCESSING APPARATUS FOR PROCESSING SAME, AND RECORDING MEDIUM COMPRISING HYDROCARBON AND HALOGEN-BASED PRECURSORS

BACKGROUND

Technical Field

The present invention relates to a method of manufacturing a semiconductor device, a substrate processing apparatus, and a recording medium.

Related Art

As one process of semiconductor device manufacturing processes, a film-forming process of forming a film on a substrate is performed by performing a cycle a predetermined number of times, the cycle including supplying a precursor containing a predetermined element into a process chamber accommodating a substrate, maintaining a state where the precursor is confined in the process chamber, and exhausting the process chamber.

In the film-forming process, a composition of the film formed on the substrate is greatly affected by the kind of precursor confined in the process chamber. Therefore, when a single type of a precursor is used as the precursor, it is difficult to change a composition of a film formed on a substrate.

The present invention provides a technique that can improve a controllability of a composition ratio of a film formed on a substrate.

SUMMARY

According to an aspect of the present invention, provided is a technique of forming a film containing a first element and a second element on a substrate by performing a cycle a predetermined number of times. The cycle includes: (a) supplying a hydro-based precursor containing the first element and a halogen-based precursor containing the second element into a process chamber accommodating a substrate to confine the hydro-based precursor and the halogen-based precursor in the process chamber; (b) maintaining a state where the hydro-based precursor and the halogen-based precursor are confined in the process chamber; and (c) exhausting the process chamber.

According to an aspect of the present invention, it is possible to improve a controllability of a composition ratio of a film formed on a substrate.

DETAILED DESCRIPTION

Embodiment

Hereinafter, an embodiment of the present invention will be described with reference to FIGS. 1 to 3.

(1) Configuration of Substrate Processing Apparatus

Figure 1:
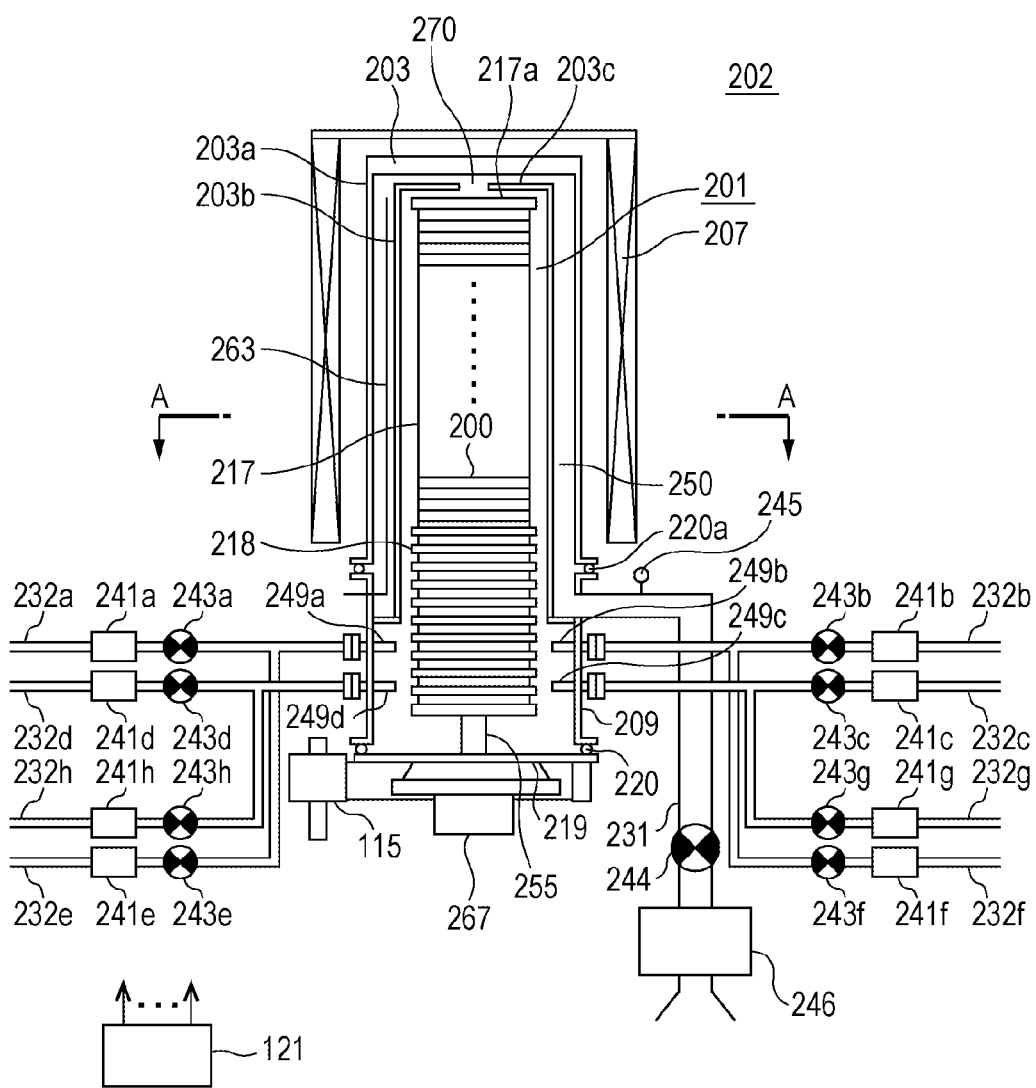
FIG. 1 is a schematic configuration diagram of a vertical process furnace of a substrate processing apparatus suitably used in an embodiment of the present invention and a longitudinal sectional view of a process furnace part.
Figure 2:
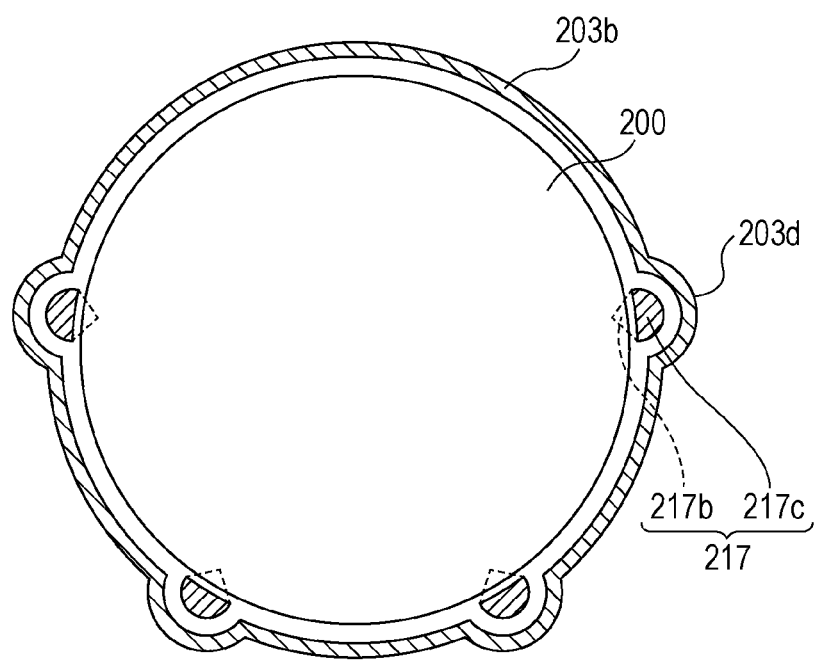
FIG. 2 is a schematic configuration diagram of the vertical process furnace of the substrate processing apparatus suitably used in the embodiment of the present invention and a cross-sectional view of the process furnace part, taken along line A-A of FIG. 1.

As illustrated in FIG. 1, a process furnace 202 includes a heater 207 as a heating unit (heating mechanism). The heater 207 has a cylindrical shape and is vertically installed by being supported to a heater base (not illustrated) as a holding plate. As described below, the heater 207 functions as an activation mechanism (excitation unit) that activates (excite) gas by heat.

Inside the heater 207, a process tube 203 serving as a reaction tube is disposed to configure a reaction vessel (processing vessel) that is coaxial to the heater 207. The process tube 203 is configured by an inner tube 203b as an inner reaction tube, and an outer tube 203a as an outer reaction tube provided in the outside thereof.

The inner reaction tube 203b is made of a heat resistant material, such as quartz ($SiO_2$) or silicon carbide (SiC), and is formed to have a cylindrical shape with a closed upper end (upper end part) and an opened lower end (lower end part). In a cylindrical hollow part of the inner tube 203b, wafers 200 as substrates subjected to a thin-film forming process are accommodated in a state of being arranged in multiple stages. Hereinafter, accommodation regions of the wafers 200 in the inside of the inner tube 203b are also referred to as wafer arrangement regions (substrate arrangement regions).

An upper end part (ceiling part) of the inner tube 203b is configured to cover at least a portion of an upper end surface (top plate) 217a of a boat 217 as a support tool to be described below. The upper end part of the inner tube 203b may be configured to cover at least a portion of a surface of the wafer 200. The upper end part 203c of the inner tube 203b is provided in parallel to the upper end surface 217a of the boat 217 configured to be flat and in parallel to the surface of the wafer 200 and has a structure in which at least an inner surface thereof is flat. An outer surface of the upper end part 203c of the inner tube 203b also has a flat structure. Since the upper end part 203c of the inner tube 203b extends from an upper end of a sidewall part of the inner tube 203b to the inside of the inner tube 203b, the upper end part 203c of the inner tube 203b can also be referred to as an extension part. In a central portion (center portion) of the upper end part 203c of the inner tube 203b, a communication part (opening part) 270 is provided to communicate the inside of the inner tube 203b with the inside of the outer tube 203a to be described below. That is, the upper end part 203c of the inner tube 203b is configured by a plate member (plate) having a donut shape (ring shape) with an opening in a central portion thereof. From this shape, the upper end part 203c of the inner tube 203b can be referred to as an orifice-shaped member or simply an orifice. The communication part 270 may be provided in a portion except for the central portion of the upper end part 203c of the inner tube 203b, for example, a peripheral portion or the like of the upper end part 203c, and the sidewall part of the inner tube 203b. However, in a case where the communication part 270 is provided in the sidewall part of the inner tube 203b, it is preferable that the communication part 270 is provided in a portion that is above the wafer arrangement region and in the vicinity of the upper end part 203c, or a portion that is under the wafer arrangement region and is included in a region horizontally surrounding a heat insulating plate arrangement region where a plurality of heat insulating plates 218 to be described below is arranged in multiple stages.

The outer tube 203a is made of a heat resistant material, such as quartz or SiC. An inner diameter of the outer tube 203a is greater than an outer diameter of the inner tube 203b. The outer tube 203a is formed to have a cylindrical shape with a closed upper end (upper end part) and an opened lower end (lower end part). The outer tube 203a is provided concentrically with the inner tube 203b. The upper end part (ceiling part) of the outer tube 203a is configured to cover the upper end part (ceiling part) 203c of the inner tube 203b.

The upper end part of the outer tube 203a is provided in parallel to the upper end part 203c of the inner tube 203b, or in parallel to the upper end surface (top plate) 217a of the boat 217, or in parallel to the surface of the wafer 200, and has a structure in which at least the inner surface thereof is flat. That is, the inner surface of the top end part of the outer tube 203a is configured with a plane. An outer surface of the upper end part of the outer tube 203a also has a flat structure and is configured with a plane. The upper end part of the outer tube 203a is configured such that a thickness thereof is thicker than a thickness of the sidewall part of the outer tube 203a, and is configured such that the strength of the outer tube 203a can be maintained even when the inside of the outer tube 203a is set to a predetermined degree of vacuum. The upper end part of the outer tube 203a is configured such that the thickness thereof is thicker than the upper end part 203c of the inner tube 203b or the sidewall part of the inner tube 203b.

A process chamber 201 is configured by, mainly, the outer tube 203a and the inner tube 203b having the above-described configuration. The process chamber 201 is configured such that the wafers 200 can be accommodated in a state of being aligned in a horizontal posture and in multiple stages by the boat 217 to be described below.

Due to the configurations of the outer tube 203a and the inner tube 203b to be described below, it is possible to reduce an actual volume of the process chamber 201, limit a region where an active material (hereinafter also referred to as an active species) is generated by decomposing a process gas to be described below (to narrow the region to the minimum), and suppress the generation of various active species.

That is, due to the flat-flat structure that flatly configures the inner surface of the upper end part (ceiling part) 203c of the outer tube 203a and the outer surface of the upper end part (ceiling part) of the inner tube 203b, the volume of the space sandwiched between these ceiling parts can be reduced. Therefore, it is possible to reduce the actual volume of the process chamber 201, limit (reduce) the region where the active species is generated by decomposing the process gas, and suppress the generation of various active species. In addition, due to the flat-flat structure that covers at least a portion of the upper end surface 217a of the flatly configured boat 217 with the upper end part 203c of the inner tube 203b while flatly configuring the inner surface of the upper end part 203c of the inner tube 203b, it is possible to reduce the volume of the space sandwiched between the inner surface of the upper end part 203c of the inner tube 203b and the upper end surface 217a of the boat 217. Therefore, it is possible to further reduce the actual volume of the process chamber 201, further limit (reduce) the region where the active species is generated by decomposing the process gas, and further suppress the generation of various active species.

By reducing the volume of the space sandwiched between the inner surface of the upper end part (ceiling part) of the outer tube 203a and the outer surface of the upper end part (ceiling part) 203c of the inner tube 203b and the volume of the space sandwiched between the inner surface of the upper end part 203c of the inner tube 203b and the upper end surface 217a of the boat 217, it can be easier to consume the active species generated in these spaces. As a result, it is possible to appropriately reduce the concentration of the active species in these spaces.

That is, by increasing a ratio (surface area/volume) of the surface area to the volume of the space sandwiched between the inner surface of the ceiling part of the outer tube 203a and the outer surface of the ceiling part of the inner tube 203b, it is possible to increase a ratio (consumption amount/generation amount) of "amount of the active species consumed in contact with the surface of the space" (surface of the member such as the outer tube 203a or the inner tube 203b) to "amount of the active species generated in the space". Similarly, by increasing a ratio (surface area/volume) of the surface area to the volume of the space sandwiched between the inner surface of the upper end part 203c of the inner tube 203b and the upper end surface 217a of the boat 217, it is possible to increase a ratio (consumption amount/generation amount) of "amount of the active species consumed in contact with the surface of the space" (surface of the member such as the inner tube 203b or the boat 217) to "amount of the active species generated in the space". That is, by increasing the ratio of the surface area to the volume with respect to these spaces, it can be easier to consume the active species generated in these spaces. As a result, it is possible to appropriately reduce the concentration of the active species in these spaces.

In addition, due to the configuration in which the upper end part 203c of the inner tube 203b covers at least a portion of the upper end surface (top plate) 217a of the boat 217 and the communication part 270 is provided in the upper end part 203c of the inner tube 203b, it is possible to extend a distance until an active species as a reactive species generated in the space above the upper end surface 217a of the boat 217 or the space between the outer tube 203a and the inner tube 203b reaches the wafer 200, and it is possible to suppress the active species from contacting the wafer 200.

That is, as a result of the configuration described above, the active species generated in the space sandwiched between the inner surface of the upper end part 203c of the inner tube 203b and the upper end surface 217a of the boat 217 cannot reach the wafer 200 unless the active species bypasses the edge of the upper end surface 217a of the boat 217. In addition, as a result of the configuration described above, the communication part 270 provided in the upper end part 203c of the inner tube 203b faces the upper end surface 217a of the boat 217 such that the communication part 270 is closed by the upper end surface 217a of the boat 217. Therefore, the active species generated in the space sandwiched between the outer tube 203a and the inner tube 203b cannot reach the wafer 200 unless the active species moves in the space, passes through the communication part 270, and then, bypasses the edge of the upper end surface 217a of the boat 217. As such, by bypassing the active species generated in the space above the upper end surface 217a of the boat 217 or the space between the outer tube 203a and the inner tube 203b, it is possible to extend a distance (path) until these active species reach the wafer 200, and the active species can be consumed before reaching the wafer 200. That is, it is possible to suppress the active species generated at these sites from contacting the wafer 200. In particular, in a case where the communication part 270 is provided in the central portion of the upper end part 203c of the inner tube 203b, it is possible to maximally extend the distance until the active species passing through the communication part 270 reaches the wafer 200, and it is easier to suppress the active species from contacting the wafer 200.

Due to these configurations, it is possible to make a uniform concentration distribution of the active species in the process chamber 201, in particular the wafer arrangement region. In addition, it is possible to suppress the influence on the film thickness and film quality by the active species generated in the space above the upper end surface 217a of the boat 217 or the space between the outer tube 203a and the inner tube 203b. As a result, it is possible to improve the uniformity of the film thickness and the film quality in the wafer in-plane and inter-plane of a thin film formed on the wafer 200.

In addition, in the above-described configuration, it is preferable to reduce a distance between the inner wall of the sidewall of the inner tube 203b (hereinafter simply referred to as the inner wall of the inner tube 203b) and the edge of the wafer 200. For example, it is preferable that the distance between the inner wall of the inner tube 203b and the edge of the wafer 200 is equal to or smaller than the distance (wafer arrangement pitch) between the adjacent wafers 200. However, as illustrated in FIG. 2, the boat 217 to be described below includes a boat pillar (boat support pillar) 217c in which a locking groove 217b supporting the wafer 200 is provided, and the boat pillar 217c is positioned at an outer side than the wafer 200. Therefore, when attempting to reduce the distance between the inner wall of the inner tube 203b and the edge of the wafer 200, the inner wall of the inner tube 203b and the boat pillar 217c contact each other and the distance between the inner wall of the inner tube 203b and the edge of the wafer 200 cannot be narrowed more than that. That is, the boat pillar 217c hinders the reduction in the distance between the inner wall of the inner tube 203b and the edge of the wafer 200. Therefore, in order to reduce the distance between the inner wall of the inner tube 203b and the edge of the wafer 200, for example, as illustrated in FIG. 2, it is preferable that a boat pillar groove 203d as a space (concave portion) avoiding the boat pillar 217c is provided in a region corresponding to the boat pillar 217c of the inner wall of the inner tube 203b. FIG. 2 illustrates only the inner tube 203b, the boat 217, and the wafer 200 supported by the boat 217 for convenience.

Due to this configuration, that is, the configuration in which the concave portion is provided in the inner wall of the inner tube 203b so as to avoid the member constituting the boat 217, the distance between the inner wall of the inner tube 203b and the edge of the wafer 200 can be reduced to the minimum.

As such, by reducing the distance between the inner wall of the inner tube 203b and the edge of the wafer 200 to the minimum, it is possible to reduce the actual volume of the process chamber 201, reduce the space where the active species is generated, and suppress the generation of various active species. Due to this configuration, it is also possible to suppress the influence on the thin film and film quality of the active species and it is also possible to realize uniform film thickness and film quality in the wafer in-plane and inter-plane.

The shape of the inner tube 203b having the upper end part 203c and the sidewall part having the above-described configurations can be referred to as a substantially cylindrical shape with respect to a pure cylindrical shape.

Under the outer tube 203a, a manifold 209 is provided concentrically with the outer tube 203a. The manifold 209 is made of, for example, stainless steel (SUS) and is formed to have a cylindrical shape with opened upper and lower ends. The manifold 209 is provided to engage the inner tube 203b and the outer tube 203a with each other and support them. An O-ring 220a is provided as a seal member between the manifold 209 and the outer tube 203a. The manifold 209 is supported to the heater base, and the process tube 203 is in a state of being vertically installed. The reaction vessel (processing vessel) is configured by, mainly, the process tube 203 and the manifold 209.

In the manifold 209, nozzles 249a to 249d as a gas inlet part are connected to pass through the sidewall of the manifold 209 and communicate with the process chamber 201. The nozzles 249a to 249d are made of, for example, a heat resistant material such as quartz or SiC. Gas supply pipes 232a to 232d are connected to the nozzles 249a to 249d, respectively. As such, the four nozzles 249a to 249d and the four gas supply pipes 232a to 232d are provided in the reaction tube 203 and are configured such that a plurality of types of process gases can be supplied into the process chamber 201.

In order from an upstream direction, mass flow controllers (MFCs) 241a to 241d being flow rate controllers (flow rate control units) and valves 243a to 243d being on-off valves are provided in the gas supply pipes 232a to 232d, respectively. In addition, on the more downstream side than the valves 243a to 243d of the gas supply pipes 232a to 232b, gas supply pipes 232e to 232h are connected to supply inert gas. In order from an upstream direction, MFCs 241e to 241h being flow rate controllers (flow rate control units) and valves 243e to 243h being on-off valves are provided in the gas supply pipes 232e to 232h, respectively. In addition, the above-described nozzles 249a to 249d are connected to front ends of the gas supply pipes 232a to 232d, respectively.

As a hydro-based precursor containing a predetermined element, for example, an organic silane precursor gas containing silicon (Si) and carbon (C) as a predetermined element is supplied from the gas supply pipe 232a to the process chamber 201 through the MFC 241a, the valve 243a, and the nozzle 249a.

The organic silane precursor gas is an organic silane precursor of a gaseous state, for example, a gas obtained by vaporizing an organic silane precursor that is a liquid state under normal temperature and normal pressure, or an organic silane precursor that is a gaseous state under normal temperature and normal pressure. A case where the term "precursor" is used in this specification is a case that means "a liquid precursor of a liquid state", a case that means a "precursor gas of a gaseous state", or a case that means both of them. Therefore, a case where the term "precursor" is used in this specification is a case that means "a precursor of a liquid state", a case that means a "precursor gas of a gaseous state", or a case that means both of them.

As the organic silane precursor, an organic compound consisting of three elements of Si, C, and hydrogen (H) is preferably used. That is, as the organic silane precursor, organic compounds respectively containing a chemical bond (Si—C bond) of Si and C, a bond (Si—H bond) of Si and H, and a chemical bond (C—H bond) of C and H in a chemical structure (1 molecular) thereof are preferably used. In addition, as the organic silane precursor, an organic compound constituting a chain compound (acyclic compound) containing a C chain structure, that is, a bond in which C is bonded in a chain shape, that is, a molecular structure that has a straight-line shape and has no ring is preferably used. As the chain compound, a chain compound having a branch as well as a straight-chain compound having no branch can be used. Specifically, as the organic silane precursor, an organic compound including a chain skeleton in which C is bonded in a chain shape, Si bonded to C1 constituting the chain skeleton, and H bonded respectively to C constituting the chain skeleton and Si bonded thereto in the chemical structure thereof is used. In addition, as the organic silane precursor, an organic compound having only one C, that is, an organic compound not having a C chain structure can be used. The organic silane precursor acts as a Si source (silicon source) and a C source (carbon source) when a SiC film is formed.

As the organic silane precursor, for example, 1,4-disilabutane ($Si_2C_2H_{10}$, abbreviated to DSB) can be used. In a case where a liquid precursor that is a liquid state under normal temperature and normal pressure is used as the organic silane precursor, the liquid precursor can be vaporized by a vaporization system, such as a vaporizer or a bubbler, and be supplied as an organic silane precursor gas (DSB gas).

As a halogen-based precursor containing a predetermined element, for example, a halosilane precursor gas containing Si as a predetermined element and chlorine (Cl) as a halogen element is supplied from the gas supply pipe 232b to the process chamber 201 through the MFC 241b, the valve 243b, and the nozzle 249b.

The halosilane precursor gas is a halosilane precursor of a gaseous state, for example, a gas obtained by vaporizing a halosilane precursor that is a liquid state under normal temperature and normal pressure, or a halosilane precursor that is a gaseous state under normal temperature and normal pressure. The halosilane precursor is a silane precursor having a halogen group. The halogen group includes a chloro group, a fluoro group, a bromo group, an iodine group, and the like. That is, the halogen group includes a halogen element, such as chlorine (Cl), fluorine (F), bromine (Br), and iodine (I). The halosilane precursor is also referred to as a type of a halide. As the halosilane precursor gas, a halide containing a chemical bond of Si and a halogen element in the chemical structure thereof is preferably used. That is, as the halosilane precursor gas, a halide containing at least one chemical bond selected from the group consisting of a Si—Cl bond, a Si—F bond, a Si—Br bond, and a Si—I bond in the chemical structure thereof is preferably used. In addition, as the halosilane precursor gas, a C-free halide, that is, an inorganic halide that does not act as a C source, is preferably used.

As the halosilane precursor gas, for example, a precursor gas containing Si and Cl, that is, a chlorosilane precursor gas can be used. As the chlorosilane precursor gas, for example, hexachlorodisilane ($Si_2Cl_8$, abbreviated to HCDS) gas can be used. In a case where a liquid precursor, such as an HCDS, which is a liquid state under normal temperature and normal pressure is used, the liquid precursor can be vaporized by a vaporization system, such as a vaporizer or a bubbler, and be supplied the halosilane precursor gas (HCDS gas).

As a reactant gas having a different chemical structure (molecular structure) from the above-described precursor gas, for example, an oxygen (O)-containing gas is supplied from the gas supply pipe 232c to the process chamber 201 through the MFC 241c, the valve 243c, and the nozzle 249c. The oxygen-containing gas acts as an oxidation gas, that is, an O source (oxidizing agent), in a substrate processing process to be described below. As the oxygen-containing gas, for example, oxygen ($O_2$) gas can be used.

As the reactant gas having a different chemical structure from the above-described precursor gas, for example, a boron (B)-containing gas is supplied from the gas supply pipe 232c to the process chamber 201 through the MFC 241c, the valve 243c, and the nozzle 249c. As the boron-containing gas, for example, a borane-based gas can be used. The borane-based gas is a borane compound of a gaseous state, for example, a gas obtained by vaporizing a borane compound that is a liquid state under normal temperature and normal pressure, or a borane compound that is a gaseous state under normal temperature and normal pressure. The borane compound includes a borane compound containing B and a halogen element, for example, a chloroborane compound containing B and Cl. In addition, the borane compound includes a borane (borohydride) such as monoborane ($BH_3$) or diborane ($B_2H_6$), and a borane compound (borane derivative) in which H of the borane is substituted for other element or the like. The borane-based gas acts as a B source in a substrate processing process to be described below. As the borane-based gas, for example, trichloroborane gas ($BCl_3$) can be used.

As a reactant gas having a different chemical structure from the above-described precursor gas, for example, a nitrogen (N)-containing gas is supplied from the gas supply pipe 232d to the process chamber 201 through the MFC 241d, the valve 243d, and the nozzle 249d. As the nitrogen-containing gas, for example, a hydrogen nitride gas can be used. The hydrogen nitride gas is not a material consisting of two elements of N and H and acts as a nitridation gas, that is, an N source (nitriding agent), in a substrate processing process to be described below. As the hydrogen nitride-based gas, for example, ammonia ($NH_3$) gas can be used.

An inert gas is supplied from the gas supply pipes 232e to 232h to the process chamber 201 through the MFCs 241e to 241h, the valves 243e to 243h, the gas supply pipes 232a to 232d, and the nozzles 249a to 249d. The inert gas acts as a purge gas or a carrier gas in a substrate processing process to be described below. As the inert gas, for example, nitrogen (N₂) gas can be used.

In a case where the above-described gases are supplied from the respective gas supply pipes, a hydro-based precursor supply system is configured by, mainly, the gas supply pipe 232a, the MFC 241a, and the valve 243a. The nozzle 249a may be included in the hydro-based precursor supply system. The hydro-based precursor supply system can also be referred to as a hydro-based precursor gas system. In a case where the organic silane precursor is supplied as the hydro-based precursor, the hydro-based precursor supply system can also be referred to as an organic silane precursor supply system or an organic silane precursor gas supply system.

In addition, the halogen-based precursor supply system is configured by, mainly, the gas supply pipe 232b, the MFC 241b, and the valve 243b. The nozzle 249b may be included in the halogen-based precursor supply system. The hydro-based precursor supply system can also be referred to as a hydro-based precursor gas system. In a case where the halosilane precursor is supplied as the halogen-based precursor, the halogen-based precursor supply system can also be referred to as a halosilane precursor supply system or a halosilane precursor gas supply system.

In a case where the oxygen-containing gas is supplied from the gas supply pipe 232c, an oxygen-containing gas supply system is configured by, mainly, the gas supply pipe 232c, the MFC 241c, and the valve 243c. The nozzle 249c may be included in the oxygen-containing gas supply system. The oxygen-containing gas supply system can also be referred to as an oxidation gas supply system or an oxidizing agent supply system.

In addition, in a case where the boron-containing gas is supplied from the gas supply pipe 232c, a boron-containing gas supply system is configured by, mainly, the gas supply pipe 232c, the MFC 241c, and the valve 243c. The nozzle 249c may be included in the boron-containing gas supply system. In a case where the borane-based gas is supplied from the gas supply pipe 232c, the boron-containing gas supply system can also be referred to as a borane-based gas supply system or a borane supply system.

In addition, the nitrogen-containing gas supply system is configured by, mainly, the gas supply pipe 232d, the MFC 241d, and the valve 243d. The nozzle 249d may be included in the nitrogen-containing gas supply system. The nitrogen-containing gas supply system can also be referred to as a nitridation gas supply system or a nitriding agent supply system. In a case where the hydrogen nitride-based gas is supplied from the gas supply pipe 232d, the nitrogen-containing gas supply system can also be referred to as a hydrogen nitride gas supply system or a hydrogen nitride supply system.

In addition, an inert gas supply system is configured by, mainly, the gas supply pipes 232e to 232h, the MFCs 241e to 241h, and the valves 243e to 243h. The inert gas supply system can also be referred to as a purge gas supply system or a carrier gas supply system.

In addition, at least one of the hydro-based precursor supply system and the halogen-based precursor supply system can also be referred to as a precursor supply system or a precursor gas supply system. In addition, at least one of the oxygen-containing gas supply system, the nitrogen-containing gas supply system, and the boron-containing gas supply system can also be referred to as a reactant gas supply system. In addition, the precursor (precursor gas) and the reactant gas described above can also be referred to as a process gas. In this case, at least one of the precursor supply system (precursor gas supply system) and the reactant gas supply system can also be referred to as a process gas supply system.

In the manifold 209, an exhaust pipe 231 is provided to exhaust the atmosphere inside the process chamber 201. The exhaust pipe 231 is disposed at a lower end part of a cylindrical space 250 formed by a gap between the inner tube 203b and the outer tube 203a and communicates with the cylindrical space 250. In the exhaust pipe 231, a vacuum pump 246 as a vacuum exhaust device is connected through a pressure sensor 245 as a pressure detector (pressure detection unit), which detects a pressure inside the process chamber 201, and an auto pressure controller (APC) valve 244 as a pressure regulator (pressure regulation unit). The APC valve 244 is a valve configured to perform a vacuum exhaust and a vacuum exhaust stop with respect to the process chamber 201 by opening or closing a valve in a state in which the vacuum pump 246 is operated, and to adjust a pressure inside the process chamber 201 by adjusting the degree of valve opening, based on pressure information detected by the pressure sensor 245 in a state in which the vacuum pump 246 is operated. An exhaust system is configured by, mainly, the exhaust pipe 231, the APC valve 244, and the pressure sensor 245. The vacuum pump 246 may be included in the exhaust system.

Below the manifold 209, a seal cap 219 is provided as a furnace throat lid that can airtightly close a lower end opening of the manifold 209. The seal cap 219 is configured to be brought into contact with a lower end of the manifold 209 from a vertically lower side. The seal cap 219 is made of a metal such as SUS and is formed to have a disk shape. On the top surface of the seal cap 219, an O-ring 220 is provided as a seal member that comes into contact with the lower end of the manifold 209. On a side of the seal cap 219 opposite to the process chamber 201, a rotation mechanism 267 is installed to rotate the boat 217 to be described below. A rotational shaft 255 of the rotation mechanism 267 passes through the seal cap 219 and is connected to the boat 217 to be described below. The rotation mechanism 267 is configured to rotate the wafer 200 by rotating the boat 217. The seal cap 219 is configured to be vertically elevated by a boat elevator 115 as an elevation mechanism that is vertically provided outside the process tube 203. The boat elevator 115 is configured to load the boat 217 into the process chamber 201 and unload the boat 217 from the process chamber 201 by elevating the seal cap 219. The boat elevator 115 is configured as a transfer device (transfer mechanism) that transfers the boat 217, that is, the wafer 200, to the inside or the outside of the process chamber 201.

The boat 217 as a support tool is made of a heat insulation material, such as quartz or SiC, and is configured to hold the plurality of wafers 200 in a horizontal posture and in multiple stages arranged in such a state that the centers thereof are aligned. As illustrated in FIGS. 1 and 2, the boat 217 includes at least a top plate 217a constituting the upper end surface of the boat 217, and a plurality of boat pillars 217c, herein four boat pillars 217c.

The top plate 217a is configured as a flat plate-shaped member and is configured to entirely cover the top of the wafer 200, that is, the top (flat surface) of the wafer 200 disposed at the uppermost position (uppermost portion) of the wafer arrangement region. Therefore, it is possible to extend the distance until the active species generated in the space above the upper end surface 217a of the boat 217 reaches the wafer 200. In addition, when the boat 217 is loaded into the process chamber 201, the top plate 217a is configured to face the communication part 270 disposed in the upper end part 203c of the inner tube 203b, that is, to close the communication part 270. Thus, it is possible to extend the distance until the active species generated in the space between the outer tube 203a and the inner tube 203b passes through the communication part 270 and then reaches the wafer 200, and it is possible to suppress the active species from contacting the wafer 200. As a result, it is possible to improve the uniformity of the film thickness and the film quality in the wafer in-plane and inter-plane of the thin film formed on the wafer 200.

In each of the boat pillars 217c, a plurality of locking grooves (slots) 217b is provided to support a plurality of wafers 200, for example, 25 to 200 sheets of wafers 200. Each of the boat pillars 217c is provided to be accommodated in a state of not contacting the boat pillar groove 203d in the inside of the boat pillar groove 203d, which is provided in the inner wall of the inner tube 203b. When the wafers 200 are mounted on all the locking grooves 217b, it is configured such that the gap between the wafer 200 disposed at the uppermost position of the wafer arrangement region and the top plate 217a is equal to the distance (wafer arrangement pitch) between the adjacent wafers 200. Therefore, when the boat 217 is loaded into the process chamber 201, it is possible to reduce the actual volume of the process chamber 201, limit (narrow to the minimum) the region where the active species is generated by decomposing the process gas, and suppress the generation of various active species. Thus, it is possible to suppress the influence of the active species on the film thickness and the film quality, and it is possible to realize the uniform film thickness and film quality in the wafer in-plane and inter-plane.

At the lower part of the boat 217, a heat insulation plate 218 made of, for example, a heat resistant material such as quartz or SiC, is configured to be supported in a horizontal posture and in multiple stages, so that heat from the heater 207 is hardly transmitted to the seal cap 219 side. Instead of providing the heat insulation plate 218 at the lower part of the boat 217, a heat insulation cylinder configured as a cylindrical member made of a heat resistant material such as quart or SiC may be provided. An accommodation region of the heat insulation plate 218 in the process chamber 201 is also referred to as a heat insulation plate arrangement region.

Inside the process tube 203, a temperature sensor 263 is installed as a temperature detector. An energization state of the heater 207 is adjusted based on temperature information detected by the temperature sensor 263, so that a temperature inside the process chamber 201 has a desired temperature distribution. The temperature sensor 263 is configured to have an L shape. A horizontal portion of the temperature sensor 263 is provided to pass through the manifold 209, and a vertical portion of the temperature sensor 263 is provided to rise from one end to the other end of at least the wafer arrangement region.

Figure 3:
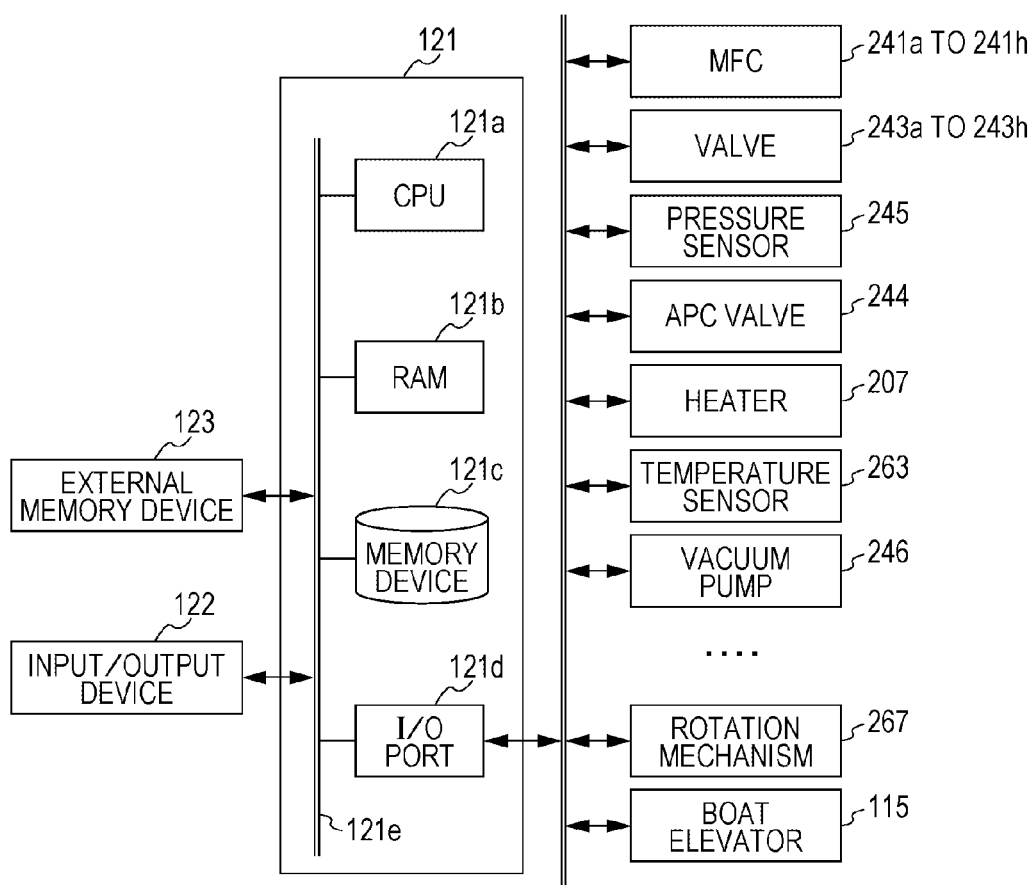
FIG. 3 is a schematic configuration diagram of a controller of the substrate processing apparatus suitably used in the embodiment of the present invention and a block diagram of a control system of the controller.

As illustrated in FIG. 3, a controller 121 being a control unit (control device) is configured by a computer that includes a central processing unit (CPU) 121a, random access memory (RAM) 121b, a memory device 121c, and an I/O port 121d. The RAM 121b, the memory device 121c, and the I/O port 121d are configured to exchange data with the CPU 121a through an internal bus 121e. An input/output device 122 configured by, for example, a touch panel, is connected to the controller 121.

The memory device 121c is configured by, for example, flash memory or a hard disk drive (HDD). A program for controlling the operation of the substrate processing apparatus or a process recipe in which a substrate processing sequence or a condition to be described below is readably recorded in the memory device 121c. The process recipe is a combination that can obtain a desired result by causing the controller 121 to perform the respective procedures of the substrate processing operation to be described below and functions as a program. Hereinafter, the process recipe or the control program will be simply collectively referred to as a program. A case where the term "program" is used in this specification is a case that includes only the process recipe, a case that includes only the control program, or a case that includes both of them. In addition, the RAM 121b is configured as a memory area (work area) that temporarily holds a program or data read by the CPU 121a.

The I/O port 121d is connected to the MFCs 241a to 241h, the valves 243a to 243h, the pressure sensor 245, the APC valve 244, the vacuum pump 246, the heater 207, the temperature sensor 263, the rotation mechanism 267, and the boat elevator 115.

The CPU 121a is configured to read and execute the control program from the memory device 121c and read the process recipe from the memory device 121c according to an input of an operation command from the input/output device 122. The CPU 121a is configured to control the operation of adjusting the flow rates of various gases by the MFCs 241a to 241h, the operation of opening/closing the valves 243a to 243h, the operation of opening/closing the APC valve 244, the operation of adjusting the pressure by the APC valve 244 based on the pressure sensor 245, the start and stop of the vacuum pump 246, the operation of adjusting the temperature of the heater 207 based on the temperature sensor 263, the operation of adjusting the rotation and rotating speed of the boat 217 by the rotation mechanism 267, and the operation of elevating the boat 217 by the boat elevator 115, so as to conform to the contents of the read process recipe.

The controller 121 is not limited to the case that is configured as a dedicated computer, and may be configured as a general-purpose computer. For example, the controller 121 according to the present embodiment can be configured by preparing an external memory device (for example, a magnetic tape, a magnetic disk such as a flexible disk or a hard disk, an optical disk such as a CD or a DVD, a magneto-optical disk such as an MO, or a semiconductor memory such as a USB or a memory card) 123, which stores the above-described program, and installing the program on a general-purpose computer by using the relevant external memory device 123. However, a unit for providing the program to the computer is not limited to a case that supplies the program through the external memory device 123. For example, the program may be provided through the external memory device 123 by using a communication unit such as the Internet or a private line. The memory device 121c or the external memory device 123 is configured as a computer-readable recording medium. Hereinafter, these will be simply collectively referred to as a recording medium. A case where the term "recording medium" is used in this specification is a case that includes only the memory device 121c, a case that includes only the external memory device 123, or a case that includes both of them.

(2) Substrate Processing Process

As one of processes of manufacturing a semiconductor device, a sequence example of forming a film on a substrate by using the above-described substrate processing apparatus will be described with reference to FIG. 4. In the following description, the operations of the respective units constituting the substrate processing apparatus are controlled by the controller 121.

Figure 4:
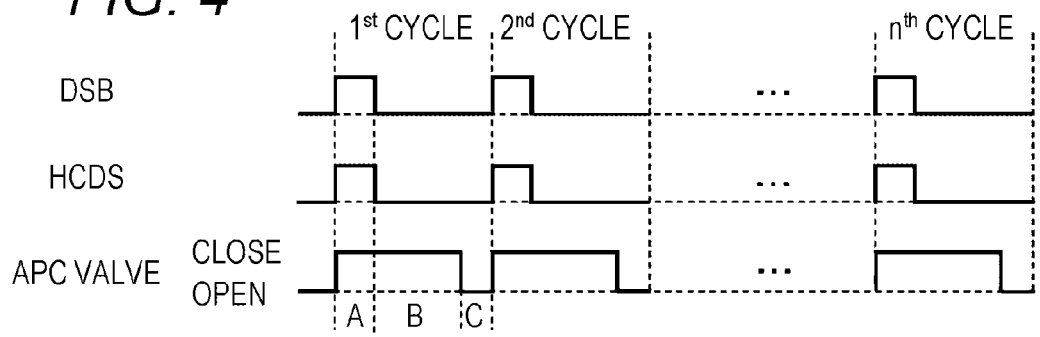
FIG. 4 is a diagram illustrating a film-forming sequence of an embodiment of the present invention.

In the film-forming sequence illustrated in FIG. 4, a description is given of an example of forming a silicon film doped with a slight amount of C as a Si-containing film on a wafer 200, that is, a C-containing Si film (C-doped Si film), by performing a cycle a predetermined number of times (one or more times) the cycle including: (A) supplying a DSB gas as a hydro-based precursor and an HCDS gas as a halogen-based precursor into the process chamber 201 accommodating the wafers 200 as the substrates to confine the DSB gas and the HCDS gas in the process chamber 201; (B) maintaining the state where the DSB gas and the HCDS gas are confined in the process chamber 201; (C) exhausting the process chamber 201.

A case where the term "wafer" is used in this specification is a case that means a "wafer itself", or a case that means a "laminate (aggregate) of a wafer and a predetermined film or layer formed on a surface thereof", that is, a case that is referred to as a wafer including a predetermined layer or film formed on a surface thereof. Also, a case where the term "surface of a wafer" is used in this specification is a case that means a "surface (exposed surface) of a wafer itself", or a case that means a "surface of a predetermined layer or film formed on a wafer, that is, an outermost surface of a wafer as a laminate".

Therefore, a case where the expression "predetermined gas is supplied to a wafer" is described in this specification is a case that means "predetermined gas is directly supplied to a surface (exposed surface) of a wafer itself", or a case that means "predetermined gas is supplied to a predetermined layer or film formed on a wafer, that is, an outermost surface of a wafer as a laminate". Also, a case where the expression "predetermined layer (or film) is formed a wafer" is described in this specification is a case that means "layer (or film) is directly formed on a surface (exposed surface) of a wafer itself", or a case that means "predetermined layer (or film) is formed on a layer or film formed on a wafer, that is, an outermost surface of a wafer as a laminate".

A case where the term "substrate" is used in this specification is the same as the case where the term "wafer" is used. In that case, in the above description, it may be considered that "wafer" is replaced with "substrate".

(Wafer Charging and Boat Loading)

A plurality of sheets of wafers 200 is charged in the boat 217 (wafer charging). At this time, the wafers 200 are charged such that no empty slots occur over the entire wafer arrangement regions. Therefore, it is possible to reduce the actual volume of the process chamber 201 during the substrate processing, limit (narrow to the minimum) the region where the active species is generated by decomposing the process gas, and suppress the generation of various active species. Thus, it is possible to suppress the influence of the active species on the film thickness and the film quality, and it is possible to realize the uniform film thickness and film quality in the wafer in-plane and inter-plane. In particular, the wafers 200 are charged such that no empty slots occur in a region near at least the communication part 270 (in the present embodiment, the upper portion of the wafer arrangement region) in the wafer arrangement region. Thus, it is possible to reduce the volume of the region near the communication part 270, and it is possible to suppress the generation of active species in the vicinity of the communication part 270. As a result, it is possible to appropriately suppress the influence of the active species on the film thickness and the film quality with respect to the wafers 200 disposed in the vicinity of the communication part 270.

After that, as illustrated in FIG. 1, the boat 217 supporting the plurality of sheets of wafers 200 is lifted by the boat elevator 115 and is loaded into the process chamber 201 (boat loading), and the plurality of sheets of wafers 200 is accommodated in the process chamber 201. In this state, the seal cap 219 is in a state of sealing the lower end of the process vessel, that is, the lower end of the manifold 209, through the O-ring 220.

(Pressure Adjustment and Temperature Adjustment)

The inside of the process chamber 201, that is, the space where the wafers 200 exist, is vacuum-exhausted to a desired pressure (degree of vacuum) by the vacuum pump 246. At this time, the pressure inside the process chamber 201 is measured by the pressure sensor 245, and the APC valve 244 is feedback-controlled based on the measured pressure information. The vacuum pump 246 maintains the always operating state at least until the processing on the wafers 200 is completed. In addition, the wafer inside the process chamber 201 is heated by the heater 207 until the wafer has a desired temperature. At this time, the energization state of the heater 207 is feedback-controlled based on the temperature information detected by the temperature sensor 263, such that the inside of the process chamber 201 has a desired temperature distribution. The heating of the inside of the process chamber 201 by the heater 207 is continuously performed at least until the processing on the wafers 200 is completed.

In addition, the valves 243e to 243h are opened, and $N_2$ gas of, for example, liter per minute, is supplied from the gas supply pipes 232e to 232h to the process chamber 201 through the MFCs 241e to 241h, the gas supply pipes 232a to 232d, and the nozzles 249a to 249d. $N_2$ purge is performed to the inside of the process chamber 201 at an arbitrary pressure for several minutes. After that, the supply of the $N_2$ gas is stopped and the $N_2$ purge is finished.

After that, in a state where the APC valve 244 is fully opened, the inside of the process chamber 201 is vacuum-exhausted by the vacuum pump 246, and the base pressure inside the process chamber 201 is set to, for example, 1 Pa or less. When the pressure inside the process chamber 201 is 1 Pa or less, the APC valve 244 is fully closed. At this time, the APC valve 244 may be slightly opened without being fully closed.

(C-Containing Si Film Forming Process)

In a state where the APC valve 244 is fully closed, the valve 243a is opened and the DSB gas is supplied into the gas supply pipe 232a. The flow rate of the DSB gas is adjusted by the MFC 241a, and the DSB gas is supplied into the process chamber 201 through the nozzle 249a. At the same time, the valve 243b is opened and the HCDS gas is supplied into the gas supply pipe 232b. The flow rate of the HCDS gas is adjusted by the MFC 241b, and the HCDS gas is supplied into the process chamber 201 through the nozzle 249b. After the elapse of a predetermined time, the valves 243a and 243b are simultaneously closed, and the supply of the DSB gas and the HCDS gas into the process chamber 201 is stopped. Through these operations, the DSB gas and the HCDS gas are confined in the process chamber 201 (step A).

When the supply of the DSB gas and the HCDS gas into the process chamber 201 is stopped, the state where the APC valve 244 is fully closed is continued for a predetermined time (reaction duration), and the state where the DSB gas and the HCDS gas are confined in the process chamber 201 is maintained (step B).

In step A or in steps A and B, in order to accelerate the diffusion of the DSB gas and the HCDS gas in the process chamber 201, the valves 243e and 243f may be opened so as to allow the $N_2$ gas to flow into the process chamber 201 through the gas supply pipes 232e, 232f, 232a, and 232b and the nozzles 249a and 249b. In addition, in order to prevent the DSB gas and the HCDS gas from being intruded into the nozzles 249c and 249d, the valves 243g and 243h may be opened so as to allow the $N_2$ gas to flow into the process chamber 201 through the gas supply pipes 232g, 232h, 232c, and 232d and the nozzles 249c and 249d.

In step A or in steps A and B, the APC valve 244 may be slightly opened without being fully closed, so that the DSB gas and the HCDS gas are slightly exhausted to slightly form the gas flow. In this case, in step A or in steps A and B, the DSB gas and the HCDS gas are exhausted from the process chamber 201 while being supplied into the process chamber 201. At that time, a state where the exhaust rate of the DSB gas and the HCDS gas from the process chamber 201 is lower than the supply rate of the DSB gas and the HCDS gas into the process chamber 201 is maintained so that the DSB gas and the HCDS gas are slightly exhausted. That is, in step A or in steps A and B, the state where the total exhaust rate from the process chamber 201 (total gas exhaust amount per unit time at a predetermined pressure, that is, exhaust flow rate (volume flow rate)) is lower than the total supply rate into the process chamber 201 (total gas supply amount per unit time at a predetermined pressure, that is, supply flow rate (volume flow rate)) may be maintained so that the DSB gas and the HCDS gas are slightly exhausted. In this case, for example, in step A, the DSB gas and the HCDS gas are exhausted from the process chamber 201 while being supplied into the process chamber 201, and the state where the exhaust rate of the DSB gas and the HCDS gas from the process chamber 201 is lower than the supply rate of the DSB gas and the HCDS gas into the process chamber 201 is formed. In step B, the state is maintained.

As such, even when the gas supplied into the process chamber 201 is slightly exhausted and each gas is slightly exhausted while being supplied, it is possible to form the substantially same confined state as the case where the APC valve 244 is fully closed. Therefore, in the present specification, it is considered that the state where the gas supplied into the process chamber 201 as described above is slightly exhausted is also included in the confined state. That is, a case where the term "confined" is used in this specification also includes not only a case where the exhaust of the process chamber 201 stopped by fully closing the APC valve 244 but also a case where the APC valve is slightly opened without being fully closed, the state where the exhaust rate from the process chamber 201 with respect to the gas supplied into the process chamber 201 is lower than the supply rate into the process chamber 201 with respect to the gas supplied into the process chamber 201 is maintained, and the gas supplied into the process chamber 201 is slightly exhausted.

In step A, the supply flow rate of the DSB gas controlled by the MFC 241a is set to a flow rate of a range of, for example, 100 sccm to 300 sccm. In addition, the supply flow rate of the HCDS gas controlled by the MFC 241b is set to a flow rate of a range of, for example, 100 sccm to 2,700 sccm. When the total supply flow rate of the DSB gas and the HCDS gas is less than 200 sccm, the deposition rate of the C-containing Si film formed on the wafer 200 is extremely reduced and the deposition of the C-containing Si film may become difficult. In addition, when the total supply flow rate of the DSB gas and the HCDS gas exceeds 3,000 sccm, the deposition rate of the C-containing Si film is significantly increased and the thickness uniformity or the step coverage of the C-containing Si film may be deteriorated. In addition, in step A or in steps A and B, the supply flow rates of the $N_2$ gas controlled by the MFCs 241e and 241h are set to a flow rate of a range of, for example, 100 to 10,000 sccm, respectively.

In addition, in step A, the supply time of the DSB gas and the HCDS gas is set to a time in a range of, for example, 1 second to 60 seconds. When each supply time of the DSB gas and the HCDS gas is less than 1 second, valve control is difficult. When each supply time of the DSB gas and the HCDS gas exceeds 60 seconds, the total time required in steps A to C is excessively long, thus causing a reduction in the productivity of the film-forming process. That is, in step A, it is preferable that an appropriate amount of DSB gas and an appropriate amount of HCDS gas are supplied in a short time (the execution time of step A is set as short as possible) and the reaction duration (the execution time of step B) is as long as possible.

In addition, in step B, the time (reaction duration) for which the state where the DSB gas and the HCDS gas are confined in the process chamber 201 is a time in a range of, for example, 0.5 to 30 minutes, preferably 0.5 to 20 minutes, and more preferably 0.5 to 10 minutes. According to the processing condition, the reaction duration can be set to several minutes, for example, 2 to 5 minutes. When the reaction duration exceeds 0.5 minutes, that is, less than 30 seconds, the reaction between the DSB gas and the HCDS gas has not sufficiently progressed, and the deposition rate of the C-containing Si film is extremely reduced. Thus, the deposition of the C-containing Si film may become difficult. When the reaction duration exceeds 30 seconds, the consumption amount of the DSB gas or the HCDS gas confined in the process chamber 201 is reduced. Although the reaction required in the film formation occurs, the reaction efficiency is reduced. That is, if that state is continued, the deposition is continued in the state where the deposition rate is lowered. That is, if the reaction duration is excessively long, the productivity of the film-forming process may be reduced. When the reaction duration is 30 minutes or less, preferably 20 minutes or less, and more preferably 10 minutes or less, the reaction can be continued in the state where the reaction efficiency is high, that is, the deposition rate is high.

In addition, in step A, the supply flow rate and the supply time of each gas are set to the above-described ranges, respectively, such that the pressure (total pressure) inside the process chamber 201 in step B, or the total pressure of the partial pressure of the DSB gas and the partial pressure of the HCDS gas in the process chamber 201 in step B, is set to a pressure in a range of, for example, 20 to 400 Pa. When the pressure inside the process chamber 201, or the total pressure of the partial pressure of the DSB gas and the partial pressure of the HCDS gas in the process chamber 201, is less than 20 Pa, the deposition rate of the C-containing Si film is extremely reduced. Thus, the deposition of the C-containing Si film may become difficult. When the pressure inside the process chamber 201, or the total pressure of the partial pressure of the DSB gas and the partial pressure of the HCDS gas in the process chamber 201, exceeds 400 Pa, an excessive vapor reaction (CVD reaction) occurs. Thus, the thickness uniformity or the step coverage of the C-containing Si film may be deteriorated and the control thereof may become difficult. In addition, the time required in the exhaust of the process chamber 201 in step C to be described below becomes long, thus causing a reduction in the productivity of the film-forming process In addition, in step A, the supply flow rate and the supply time of each gas are set to the above-described ranges, respectively, such that the ratio (amount (partial pressure) of DSB gas/amount (partial pressure) of HCDS gas) of the amount (partial pressure) of the DSB gas with respect to the amount (partial pressure) of the HCDS gas in the process chamber 201 in step B is set to a range of, for example, 1/9 to 1, and preferably 1/9 to 1/4. By adjusting the above-described ratio, that is, the ratio of the amount (partial pressure) of the precursor gas (DSB gas) that acts as the C source with respect to the amount (partial pressure) of the precursor gas (HCDS gas) that does not act as the C source, it is possible to control the ratio of the Si component to the C component in the finally formed C-containing Si film, that is, the composition ratio. For example, by lowering (reducing) the above-described ratio (DSB/HCDS), it is possible to lower (reduce) the C concentration in the C-containing Si film. In addition, by raising (increasing) the above-described ratio (DSB/HCDS), it is possible to raise (increase) the C concentration in the C-containing Si film.

However, when the above-described ratio (DSB/HCDS) exceeds 1, the amount of the DSB gas acting as the C source is excessive relative to the amount of the HCDS gas. The C component included in the DSB gas may be excessively added to the C-containing Si film formed on the wafer 200, which is to be described below. As a result, the C concentration of the finally formed C-containing Si film exceeds 10 at % and may reach, for example, 30 at %. That is, instead of the C-containing Si film containing a slight amount of C, a SiC film may be formed on the wafer 200. In addition, since the amount of the HCDS gas is insufficient relative to the amount of the DSB gas, the reaction between the DSB gas and the HCDS gas is difficult to progress. That is, since the amount of the HCDS gas acting catalytically as described below is insufficient, the formation reaction of the C-containing Si film is difficult to progress. As a result, the deposition rate of the C-containing Si film on the wafer 200, that is, the deposition rate of the finally formed C-containing Si film, may be reduced. In addition, the consumption amount of the DSB gas that does not contribute to the film formation is increased, thus causing an increase in deposition costs of the C-containing Si film.

By setting the above-described ratio (DSB/HCDS) to 1 or less, further 1/4 or less, it is possible to suppress the excessive addition of the C component to the C-containing Si film. As a result, the C concentration of the finally formed C-containing Si film can be set to, for example, 10 at % or less, further 5 at % or less. That is, instead of the SiC film, the C-containing Si film containing a slight amount of C may be formed on the wafer 200. In addition, since the amount of the HCDS gas acting catalytically is sufficiently secured relative to the amount of the DSB gas, the reaction between the DSB gas and the HCDS gas is appropriately progressed and the deposition rate of the C-containing Si film can be increased. In addition, the consumption amount of the DSB gas that does not contribute to the film formation is decreased, thus reducing deposition costs of the C-containing Si film.

In addition, when the above-described ratio (DSB/HCDS) is less than 1/9, the amount of the DSB gas acting as the C source is insufficient relative to the amount of the HCDS gas. Thus, the amount of the C component added to the C-containing Si film becomes easily insufficient. Therefore, the C-containing Si film formed on the wafer 200, that is, the finally formed C-containing Si film, is easily polycrystallized (polymerized). As a result, the surface morphology structure (hereinafter simply referred to as morphology) of the C-containing Si film is easily deteriorated. For example, pinholes or the like easily occur on the surface of the C-containing Si film. In particular, in a case where the film thickness of the C-containing Si film formed on the wafer 200 is reduced, the influence on the morphology due to the polycrystallization becomes remarkable. In addition, when the amount of the Cl-containing HCDS gas is excessive relative to the amount of the DSB gas, many impurities such as Cl or the like contained in the HCDS gas are incorporated in the C-containing Si film, thus degrading the film quality of the C-containing Si film.

By setting the above-described ratio (DSB/HCDS) to 1/9 or more, further 1/4 or more, it is possible to add an appropriate amount of the C component to the C-containing Si film. For example, the C concentration of the finally formed C-containing Si film can be set to, for example, 2 at % or more, further 5 at % or more. Therefore, the polycrystallization of the C-containing Si film can be suppressed, and the C-containing Si film can be formed as a film of an amorphous state. As a result, the C-containing Si film can be formed as a smooth film that has excellent morphology and has no pinholes. In addition, the finally formed C-containing Si film can be formed as a high-quality film in which the impurity concentration of Cl or the like is low.

In addition, in steps A and B, in a case where the DSB gas alone is supplied into the process chamber 201, the temperature of the heater 207 is set such that the temperature of the wafer 200 becomes a temperature at which the DSB is not thermally decomposed, or a temperature at which the DSB is hardly decomposed. Specifically, the temperature of the heater 207 is set such that the temperature of the wafer 200 is in the range of, for example, 300° C. to 450° C., preferably 350° C. to 450° C., and more preferably 350° C. to 400° C.

When the temperature of the wafer 200 is lower than 300° C., the reaction between the DSB gas and the HCDS gas does not progress, and the deposition rate of the C-containing Si film is extremely reduced. Thus, the deposition of the C-containing Si film may become difficult. In addition, the impurities easily remain in the C-containing Si film and the film quality of the C-containing Si film is easily degraded.

When the temperature of the wafer 200 is equal to or higher than 300° C., the reaction between the DSB gas and the HCDS gas can progress, and the deposition rate of the C-containing Si film can be improved. In addition, the amount of the impurities remaining in the C-containing Si film can be reduced and the film quality of the C-containing Si film can be improved. In addition, when the temperature of the wafer 200 is equal to or higher than 350° C., the deposition rate of the C-containing Si film can be improved and the film quality of the C-containing Si film can be improved.

However, when the temperature of the wafer 200 exceeds 450° C., the reaction between the DSB gas and the HCDS gas becomes strong (excessive vapor reaction occurs). Therefore, the in-plane film thickness uniformity or the step coverage of the C-containing Si film may be easily deteriorated and the control thereof may become difficult. In addition, the amount of the particles generated in the process chamber 201 may be easily increased and the film quality of the C-containing Si film may be degraded. In addition, C may be easily desorbed from the C-containing Si film by cutting the Si—C bond included in the DSB gas, and the C concentration of the C-containing Si film may be reduced up to an undesired concentration.

When the temperature of the wafer 200 is equal to or lower than 400° C., it is possible to suppress the occurrence of an excessive vapor reaction while appropriately progressing the reaction between the DSB gas and the HCDS gas. As a result, the in-plane film thickness uniformity or the step coverage of the C-containing Si film can be improved. In addition, it is possible to suppress the occurrence of particles in the process chamber 201. In addition, it is possible to suppress the cutting of the Si—C bond included in the DSB gas, and it is possible to suppress the desorption of C from the C-containing Si film.

Therefore, it is preferable that the temperature of the wafer 200 is set to a temperature of a range of 300° C. to 450° C., preferably 350° C. to 450° C., and more preferably 350° C. to 400° C.

By performing steps A and B under the above-described condition, the DSB gas and the HCDS gas react with each other in the process chamber 201. At this time, due to the action of Cl contained in the HCDS gas, the bond of Si and H (Si—H bond) in the DSB gas is cut. The DSB gas has a dangling bond of Si by desorbing H and is an active material, that is, an active species. In addition, the bond of Si and Cl (Si—Cl bond) in the HCDS gas is also cut. The HCDS gas has a dangling bond of Si by desorbing Cl. Like the DSB gas, the HCDS gas is an active material, that is, an active species. The active species that is in an active state by desorbing H or Cl is rapidly adsorbed or deposited on the wafer 200 and mutually reacts during that process. As a result of this reaction, a chemical bond of Si contained in the DSB gas and Si contained in the HCDS gas, that is, Si—Si bond is formed. In addition, a chemical bond of C contained in the DSB gas and Si contained in the HCDS gas, that is, Si—C bond is formed.

A series of reactions described above is progressed, and a silicon layer to which C is added in a slight amount, that is, a C-containing Si layer is formed on the wafer 200. Since the C-containing Si layer includes many Si—Si bonds, the C-containing Si layer is a layer in which a bond between atoms constituting the layer is strong and stable. When the C-containing Si layer is formed, a gaseous by-product containing hydrogen halide such as hydrogen chloride (HCl) is generated by the reaction between the DSB gas and the HCDS gas. The gaseous by-product containing HCl is exhausted from the process chamber 201 in step C to be described below.

As described above, in the present embodiment, in a case where the DSB gas alone is supplied into the process chamber 201, the temperature condition in the process chamber 201 in steps A and B is set as a temperature condition of a low temperature at which the DSB is not thermally decomposed or a temperature at which the DSB is hardly decomposed. It is considered that the C-containing Si layer can be formed even at such a low temperature range due to the above-described action of the HCDS gas. That is, the HCDS gas acts as the Si source, that is, the precursor gas, and also acts as a catalyst that improves the formation rate of the C-containing Si layer by progressing the formation reaction of the C-containing Si film in the low temperature range in which it is difficult to form the C-containing Si layer when the DSB gas alone is used. Due to the catalytic action of the HCDS gas, it is possible to appropriately progress the process of forming the C-containing Si layer under the above-described temperature condition of the low temperature.

In addition, when the above-described reaction progresses, at least some of the Si—C bonds included in the DSB gas are held (maintained) without being cut and are incorporated in the C-containing Si layer as they are. As one factor, it is considered that the reason why at least some of the Si—C bonds included in the DSB gas are held without being cut is because the above-described reaction is performed under the temperature condition of the low temperature at which the DSB is not thermally decomposed when the DSB gas alone is supplied into the process chamber 201. In addition, as one factor, it is considered that the DSB gas is changed to the active material by the action of the HCDS gas, and the active material is rapidly adsorbed and deposited on the wafer 200. This is because when the HCDS gas cuts the Si—H bond of the DSB gas, the obtained material has an active characteristic (characteristic that adsorption and deposition are easy). The adsorption and deposition of the material on the wafer 200 are rapidly performed before the Si—C bond or the C chain structure included in the material is cut. As a result, in a state where the Si—C bond or the C chain structure in the DSB gas is held (protected), the C-containing Si film is formed and the C component is incorporated in the C-containing Si layer.

The amount of the Si—C bonds in the C-containing Si layer formed in the present embodiment is smaller than the amount of the Si—C bonds in the layer formed without supplying the HCDS gas into the process chamber 201, that is, the layer formed by supplying the DSB gas alone into the process chamber 201 and thermally decomposing the DSB gas. That is, the C concentration in the C-containing Si layer formed in the present embodiment is smaller (lower) than the C concentration in the layer formed without supplying the HCDS gas into the process chamber 201. In addition, the amount of the Si—Si bonds in the C-containing Si layer formed in the present embodiment is larger than the amount of the Si—Si bonds in the layer formed without supplying the HCDS gas into the process chamber 201. This is because, in the present embodiment, the DSB gas that acts as the C source and the HCDS gas that does not act as the C source are used together. The C-containing Si layer formed by using two kinds of precursor gases, that is, the DSB gas and the HCDS gas, is a layer that has a large amount of Si—Si bonds and a small amount of Si—C bonds, that is, has a high Si concentration and a low C concentration, as compared with the layer formed by using the DSB gas alone.

When the C-containing Si layer having a predetermined thickness is formed after the elapse of the above-described reaction duration, the APC valve 244 is fully opened to rapidly exhaust the process chamber 201 (step C). At this time, the unreacted process gas remaining in the process chamber 201, the process gas after contributing to the reaction, or the above-described by-product is exhausted from the process chamber 201 through the communication part 270 in the upper end part 203*c* of the inner tube 203*b* and the cylindrical space 250 between the inner tube 203*b* and the outer tube 203*a* by the exhaust pipe 231. At this time, the valves 243*e* to 243*h* are opened and $N_2$ gas is supplied into the process chamber 201. The $N_2$ gas acts as purge gas. This can further increase the effect that the unreacted process gas, the process gas after contributing to the reaction, or the by-product is removed from the process chamber 201.

(Performing a Predetermined Number of Times)

The cycle including steps A to C, that is, the cycle that sequentially performs step A, step B, and step C, is performed a predetermined number of times, and preferably two or more times (n times). That is, the C-containing Si film having a predetermined composition and a predetermined thickness can be formed on the wafer 200.

In a case where the cycle is performed two or more times, in each process after at least two cycles, a portion described as "forming a predetermined layer on the wafer 200" means "forming a predetermined layer on a layer formed on the wafer 200, that is, on the uppermost surface of the wafers 200 as a laminate". This point is the same as described above. This point is also the same as in another embodiment to be described below.

(Purge and Returning to Atmospheric Pressure)

When the C-containing Si film having a predetermined composition and a predetermined thickness is formed, the valves 243e to 243h are opened and $N_2$ gas is supplied into the process chamber 201 and is exhausted from the process chamber 201. The $N_2$ gas acts as purge gas. The inside of the process chamber 201 is purged by the inert gas, so that the by-product and the gas remaining in the process chamber 201 are removed (purged) from the process chamber 201. After that, the atmosphere inside the process chamber 201 is replaced with the inert gas and the pressure inside the process chamber 201 is returned to the atmospheric pressure (returning to the atmospheric pressure).

(Boat Unloading and Wafer Discharging)

After that, the seal cap 219 is moved downward by the boat elevator 115. The lower end of the manifold 209 is opened and the boat 217 is unloaded from the lower end of the manifold 209 to the outside of the process chamber 201 in a state in which the plurality of processed wafers 200 is held to the boat 217 (boat unloading). After that, the plurality of processed wafers 200 is discharged from the boat 217 (wafer discharging).

(3) Effects of Present Embodiment

According to the present embodiment, one or more effects described below can be obtained.

(a) In steps A and B, by using a plurality of types of precursor gases having different chemical structures, that is, by using the DSB gas that acts as the C source and the HCDS gas that does not act as the C source in combination, it is possible to increase the controllability of the composition ratio of the finally formed C-containing Si film.

In a case where the Si-containing film is formed on the wafer 200 by supplying the DSB gas alone as the precursor gas without supplying the HCDS gas into the process chamber 201, the C concentration in the layer formed on the wafer 200 is greatly influenced according to the ratio (1/1 in the DSB gas) of the number of Si to the number of C included in one molecule of the DSB gas, that is, the type of the precursor gas. Therefore, under at least the above-described temperature condition, even though the processing condition such as the pressure inside the process chamber 201 or the gas supply time is controlled, it is difficult to set the C concentration in the layer formed on the wafer 200 to, for example, 10 at % or less.

In contrast, according to the present embodiment, the composition ratio of the finally formed C-containing Si film can be freely controlled by appropriately selecting a plurality of types of precursor gases to be used in combination and controlling the ratio of the amounts (partial pressures) of the respective precursors in the process chamber 201 in steps A and B. For example, by using the DSB gas that acts as the C source and the HCDS gas that does not act as the C source in combination, the C-containing Si film formed on the wafer 200 can be formed as a film having a high Si concentration and a low C concentration as compared with a film formed by using the DSB gas alone. Therefore, if the ratio of the amount of the DSB gas with respect to the amount of the HCDS gas in the process chamber 201 in steps A and B is set to a predetermined ratio of the above-described condition range, the C concentration of the C-containing Si film can be set to a concentration of, for example, 20 at % or less, preferably 10 at % or less, and more preferably 5 at % or less, even under the above-described temperature condition. That is, according to the present embodiment, the composition ratio of the C-containing Si film can be controlled as a composition ratio that cannot be realized when the DSB gas alone is used. By setting the concentration of the C-containing Si film to, for example, 20 at % or less, preferably 10 at % or less, and more preferably 5 at % or less, the polycrystallization of the C-containing Si film can be suppressed and the C-containing Si film can be formed as a smooth film that has excellent morphology and has no pinholes.

As such, according to the present embodiment, it is possible to improve the controllability of the composition ratio of the C-containing Si film and widen the window of the composition ratio control.

(b) In steps A and B, the process of forming the C-containing Si film on the wafer 200 by supplying the HCDS gas into the process chamber 201 together with the DSB gas to confine these gases in the process chamber 201 can progress even in the low temperature range (for example, the temperature range of 450° C. or less) in which it is difficult to perform the film formation when the DSB gas alone is used. That is, by making the HCDS gas act catalytically, the deposition temperature of the C-contained Si film using the DSB gas can be greatly reduced. In addition, since the film formation in such a low temperature range can be realized without using plasma, that is, under non-plasma condition, it is possible to avoid plasma damage to the wafer 200. Furthermore, it is possible to reduce manufacturing costs of the substrate processing apparatus, that is, substrate processing costs.

(c) In steps A and B, by supplying the HCDS gas into the process chamber 201 together with the DSB gas to confine these gases in the process chamber 201, the deposition rate of the C-containing Si film on the wafer 200 can be increased as compared with the deposition rate when the DSB gas alone is used. This is because, in steps A and B, the HCDS gas cuts the Si—H bonds in the DSB gas, and the obtained active material is rapidly adsorbed and deposited on the wafer 200. In addition, in steps A and B, Cl is desorbed from the HCDS gas, and the obtained active material is rapidly adsorbed and deposited on the wafer 200. Therefore, in that process, these active materials rapidly react. Therefore, the formation of the C-containing Si layer on the wafer 200, that is, the film formation of the C-containing Si film can be efficiently performed. The effect of the improved deposition rate occurs in the low temperature range (for example, 300° C. to 450° C.) in which the DSB is not thermally decomposed when the DSB gas alone is supplied into the process chamber 201, and also occurs in the temperature range (for example, 450° C. to 500° C.) in which the DSB is thermally decomposed when the DSB gas alone is supplied to the process chamber 201. As a result, the process of forming the C-containing Si film can be performed even in the low temperature range where it is difficult to perform the film formation when the DSB gas alone is used. In addition, the deposition rate can be greatly improved at any temperature range.

(d) Due to the flat-flat structure that configures the flat inner surface of the ceiling part of the outer tube 203a and the flat outer surface of the ceiling part of the inner tube 203b, the volume of the space sandwiched between these ceiling parts can be reduced. Therefore, it is possible to reduce the actual volume of the process chamber 201, and it is possible to limit the region where the DSB gas and the HCDS gas react to generate the active species. As a result, it is possible to suppress the generation of various active species. In addition, since the space sandwiched between these ceiling parts is the space having a large surface area as compared with the volume, the active species generated in this space can be easily consumed, and the concentration of the active species in this space can be appropriately reduced. As a result, it is possible to make a uniform concentration distribution of the active species in the process chamber 201, in particular the wafer arrangement region.

(e) It is possible to reduce the volume of the space sandwiched between the upper end part 203c of the inner tube 203b and the upper end surface 217a of the boat 217. Therefore, it is possible to suppress the generation of various active species. In addition, since the space sandwiched between the upper end part 203c of the inner tube 203b and the upper end surface 217a of the boat 217 is the space having a large surface area as compared with the volume, the concentration of the active species in this space can be appropriately reduced. As a result, it is possible to make a uniform concentration distribution of the active species in the process chamber 201, in particular the wafer arrangement region.

(f) It is possible to extend the distance until the active species generated in the space above the upper end surface 217a of the boat 217 or the space between the outer tube 203a and the inner tube 203b reaches the wafer 200. As a result, it is possible to suppress the active species generated at these sites from contacting the wafer 200. In particular, since the communication part 270 is provided in the central portion of the upper end part 203c of the inner tube 203b, it is possible to maximally extend the distance until the active species passing through the communication part 270 reaches the wafer 200, and it is easier to suppress the active species from contacting the wafer 200.

(g) Since the sidewall part of the inner tube 203b is configured to avoid the member constituting the boat 217, the distance between the inner wall of the sidewall part of the inner tube 203b and the edge of the wafer 200 can be reduced to a minimum, and the actual volume of the process chamber 201 can be further reduced. Therefore, it is possible to further limit the region where the DSB gas and the HCDS gas react to generate the active species. As a result, it is possible to further suppress the generation of various active species.

(h) By using the process chamber 201 configured by the outer tube 203a and the inner tube 203b configured as above, it is possible to suppress the influence of the active species on the film thickness and the film quality, and it is possible to realize a uniform film thickness and film quality in the wafer in-plane and inter-plane. The above-described effect obtained by the configuration of the outer tube 203a and the inner tube 203b as described above was remarkably confirmed, in particular, the film-forming process having a process of maintaining the state where the process gas is confined in the process chamber 201 for a predetermined time as in the present invention.

As the method of reducing the region where the DSB gas and the HCDS gas react with each other, the volume of the outer tube 203a may be changed to a necessary minimum volume by using only the outer tube 203a as the process tube 203 without using the inner tube 203b. That is, the distance between the outer tube 203a and the boat 217 may be narrowed to the necessary minimum with respect to the sidewall part and the upper end part. In this case, the necessary minimum is the range where the manufacture of the semiconductor device, the substrate processing, and the operation of the substrate processing apparatus are not damaged. In addition, in the inner surface of the outer tube 203a or the inner tube 203b, for example, a convex portion such as a protrusion or a rib and a concave portion such as a groove or a hole are provided so that the inner surface is configured to have an uneven portion. Therefore, the method of reducing the region where the DSB gas and the HCDS gas react with each other may be used.

(i) The above-described effect can also be exerted when a hydro-based precursor gas except for the DSB gas is used as the hydro-based precursor and a halogen-based precursor except for the HCDS gas is used as the halogen-based precursor.

(4) Modification

The film-forming process according to the present embodiment is not limited to the above-described aspect, and the following modifications can be made.

(Modification 1)

Figure 5:
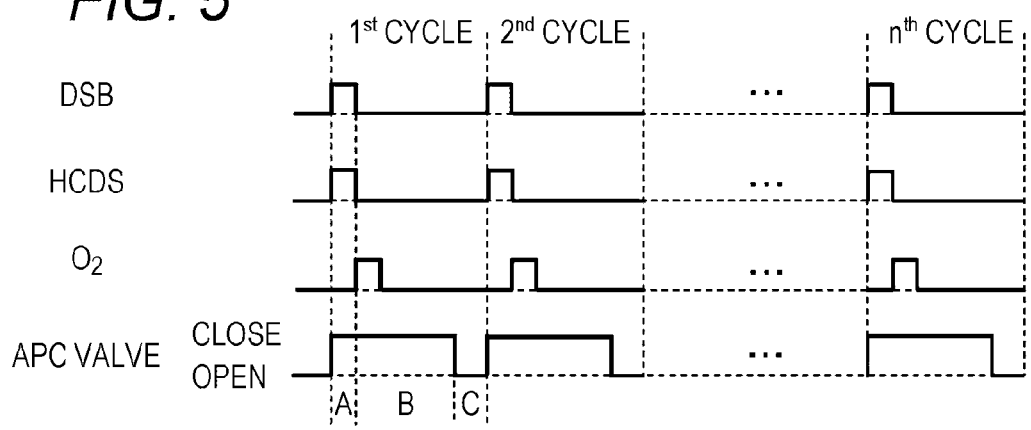
FIG. 5 is a diagram illustrating modification 1 of the film-forming sequence of the embodiment of the present invention.

As illustrated in FIG. 5, in step B or the like, $O_2$ gas may be supplied into the process chamber 201 as the oxygen-containing gas. The $O_2$ gas is supplied from the gas supply pipe 232c to the process chamber 201 through the MFC 241c, the valve 243c, and the nozzle 249c. The supply flow rate of the $O_2$ gas can be set to a flow rate of a range of, for example, 100 to 1,000 sccm. The other processing procedures and processing conditions can be the same processing procedures and processing conditions as the film-forming sequence described with reference to FIG. 4. According to the present modification, as the film containing Si and O, it is possible to form a silicon oxide film to which C is added in a slight amount, that is, a C-containing SiO film (C-doped SiO film), on the wafer 200. Even in the present modification, the same effect as the above-described embodiment can be obtained.

In addition to the $O_2$ gas, for example, nitrous oxide ($N_2O$) gas, nitrogen monoxide (NO) gas, nitrogen dioxide ($NO_2$) gas, ozone ($O_3$) gas, hydrogen ($H_2$) gas+$O_2$ gas, $H_2$ gas+$O_3$ gas, water vapor ($H_2O$), carbon monoxide (CO) gas, or carbon dioxide ($CO_2$) gas can be used as the oxygen-containing gas.

(Modification 2)

Figure 6:
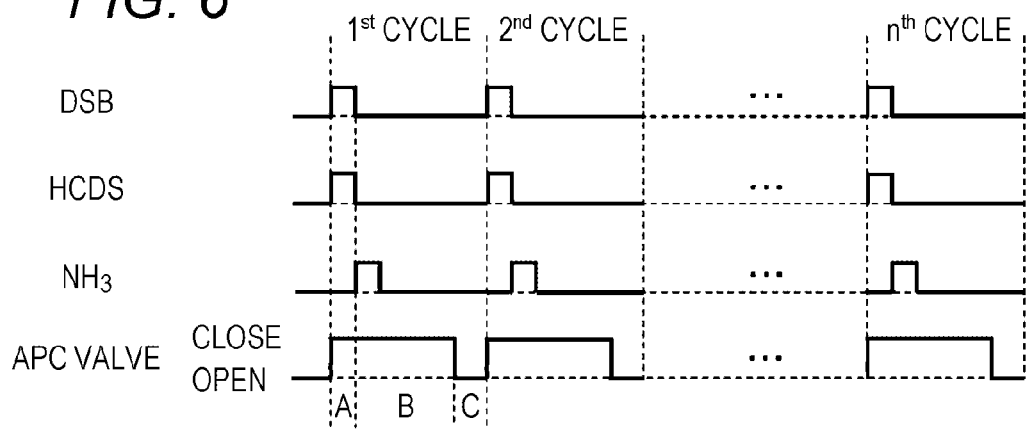
FIG. 6 is a diagram illustrating modification 2 of the film-forming sequence of the embodiment of the present invention.

As illustrated in FIG. 6, in step B or the like, $NH_3$ gas may be supplied into the process chamber 201 as the nitrogen-containing gas. The $NH_3$ gas is supplied from the gas supply pipe 232d to the process chamber 201 through the MFC 241d, the valve 243d, and the nozzle 249d. The supply flow rate of the $NH_3$ gas can be set to a flow rate of a range of, for example, 100 to 1,000 sccm. The other processing procedures and processing conditions can be the same processing procedures and processing conditions as the film-forming sequence described with reference to FIG. 4. According to the present modification, as the film containing Si and N, it is possible to form a silicon nitride film to which C is added in a slight amount, that is, a C-containing SiN film (C-doped SiN film), on the wafer 200. Even in the present modification, the same effect as the above-described embodiment can be obtained.

In addition to the $NH_3$ gas, for example, diazene ($N_2H_2$) gas, hydrazine ($N_2H_4$) gas, or $N_3H_8$ gas can be used as the hydrogen nitride-based gas.

(Modification 3)

Figure 7:
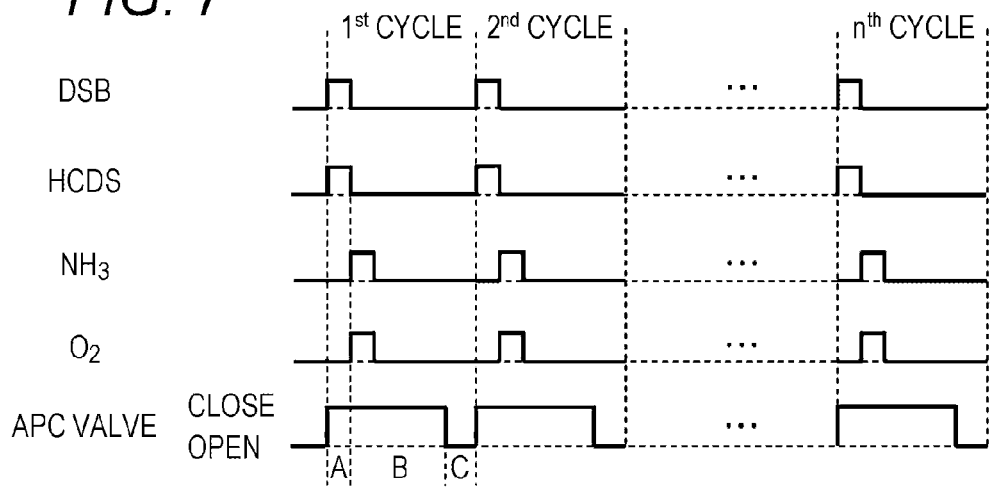
FIG. 7 is a diagram illustrating modification 3 of the film-forming sequence of the embodiment of the present invention.

As illustrated in FIG. 7, in step B or the like, $NH_3$ gas and $O_2$ gas may be supplied into the process chamber 201. The processing procedures and processing conditions of the present modification can be the same processing procedures and processing conditions as the film-forming sequence described with reference to FIG. 4 or modifications 1 and 2. According to the present modification, as the film containing Si, O, and N, it is possible to form a silicon oxynitride film to which C is added in a slight amount, that is, a C-containing SiON film (C-doped SiON film), on the wafer 200. Even in the present modification, the same effect as the above-described embodiment can be obtained.

(Modification 4)

Figure 8:
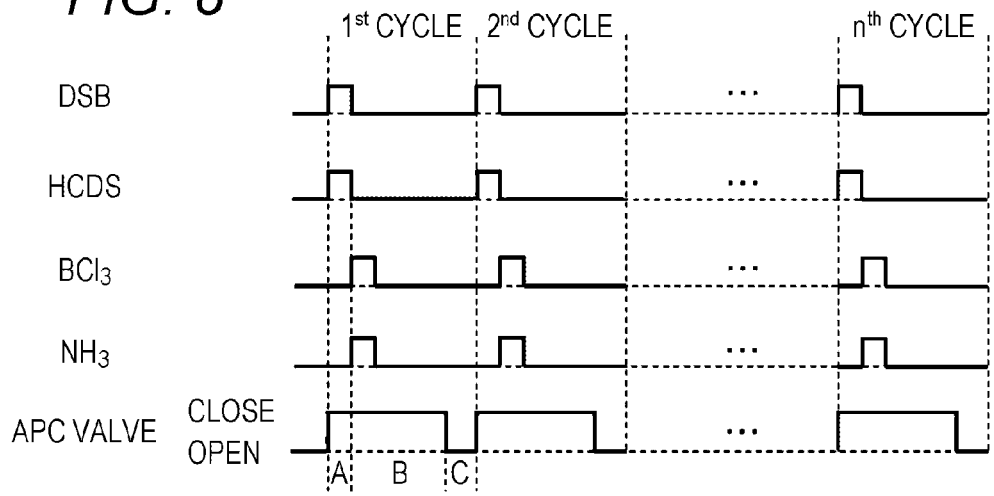
FIG. 8 is a diagram illustrating modification 4 of the film-forming sequence of the embodiment of the present invention.

As illustrated in FIG. 8, in step B or the like, $BCl_3$ gas may be supplied into the process chamber 201 as the boron-containing gas, and $NH_3$ gas may be supplied. The $BCl_3$ gas is supplied from the gas supply pipe 232c to the process chamber 201 through the MFC 241c, the valve 243c, and the nozzle 249c. The supply flow rate of the $BCl_3$ gas can be set to a flow rate in a range of, for example, 100 to 1,000 sccm. The other processing procedures and processing conditions can be the same processing procedures and processing conditions as the film-forming sequence described with reference to FIG. 4 or modification 2. According to the present modification, as the film containing Si, B, and N, it is possible to form a silicon boride nitride film to which C is added in a slight amount, that is, a C-containing SiBN film (C-doped SiBN film), on the wafer 200. Even in the present modification, the same effect as the above-described embodiment can be obtained.

In addition to the $BCl_3$ gas, monochloroborane ($BClH_2$) gas, dichloroborane ($BCl_2H$) gas, trifluoroborane ($BF_3$), tribromoborane ($BBr_3$) gas, and diborane ($B_2H_6$) gas can be used as the boron-containing gas.

(Modification 5)

In a case where the organic silane precursor gas is used as the hydro-based precursor gas, besides the DSB gas, for example, at least one organic silane precursor gas selected from the group consisting of $SiC_2H_8$ gas, $Si_2CH_8$ gas, $SiC_3H_{10}$ gas, $Si_3CH_{10}$ gas, $SiC_4H_{22}$ gas, $Si_2C_3H_{12}$ gas, $Si_3C_2H_{12}$ gas, $Si_4CH_{12}$ gas, $SiC_2H_6$ gas, $SiC_3H_8$ gas, $Si_2C_2H_8$ gas, $SiC_4H_{10}$ gas, $Si_2C_3H_{10}$ gas, and $Si_3C_2H_{10}$ gas can be used. That is, as the organic silane precursor gas, for example, in a case where the carbon element is a single bond, a precursor expressed as $Si_xC_yH_{2(x+y+1)}$ (in the formula, each of x and y is an integer of 1 or more) can be preferably used. In addition, for example, in a case where the carbon element is a double bond, a precursor expressed as $Si_xC_{(y+1)}H_{2(x+y+1)}$ (in the formula, each of x and y is an integer of 1 or more) can be preferably used. These materials may include three elements of Si, C, and H and may be organic compounds respectively containing a Si—C bond, a Si—H bond, and a C—H bond in a chemical structure (1 molecular) thereof. In addition, these materials may be chain compounds containing a C chain structure in a chemical structure thereof, that is, an organic compound in which C is bonded in a chain shape in a molecule thereof.

The processing procedures and processing conditions of the present modification can be the same processing procedures and processing conditions as the film-forming sequence described with reference to FIG. 4. According to the present modification, the C-containing Si film can be formed on the wafer 200. Even in the present modification, the same effect as the above-described embodiment can be obtained.

(Modification 6)

Figure 9:
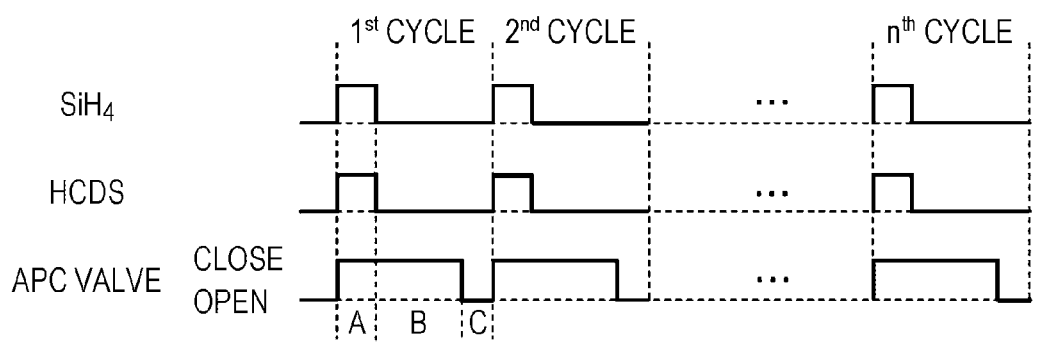
FIG. 9 is a diagram illustrating modification 6 of the film-forming sequence of the embodiment of the present invention.

Instead of the organic silane precursor gas, for example, inorganic silane precursor gas such as monosilane ($SiH_4$) gas, disilane ($Si_2H_6$) gas, and trisilane ($Si_3H_8$) gas, may be used as the hydro-based precursor. That is, C-free silane precursor gas may be used as the hydro-based precursor. The processing procedures and processing conditions of the present modification can be the same processing procedures and processing conditions as the film-forming sequence described with reference to FIG. 4. FIG. 9 illustrates an example in which $SiH_4$ gas is used as the hydro-based precursor. According to the present modification, a C-free Si film, that is, a non-doped Si film, can be formed on the wafer 200. Even in the present modification, the same effect as the above-described embodiment can be obtained.

(Modification 7)

In a case where the halosilane precursor gas is used as the halogen-based precursor gas, besides the HCDS gas, a halosilane precursor gas such as tetrachlorosilane, that is, silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas may be used. The processing procedures and processing conditions of the present modification can be the same processing procedures and processing conditions as the film-forming sequence described with reference to FIG. 4. According to the present modification, the C-containing Si film can be formed on the wafer 200. Even in the present modification, the same effect as the above-described embodiment can be obtained.

(Modification 8)

A predetermined element (first element) contained in the hydro-based precursor gas and a predetermined element (second element) included in the halogen-based precursor gas are not limited to the same types of elements and may be different types of elements. For example, as the halogen-based precursor gas, instead of the Si-containing halosilane precursor gas as the second element, the metal halide precursor gas including transition metal elements such as titanium (Ti), zirconium (Zr), hafnium (Hf), tantalum (Ta), niobium (Nb), molybdenum (Mo), or tungsten (W) and typical metal elements such as aluminium (Al) may be used as the second element. As the metal halide precursor gas, for example, $TiCl_4$ gas, $ZrCl_4$ gas, $HfCl_4$ gas, $NbCl_5$ gas, $TaCl_5$ gas, $MoCl_5$ gas, $WCl_6$ gas, and $AlCl_3$ gas can be preferably used. The processing procedures and processing conditions of the present modification can be the same processing procedures and processing conditions as the film-forming sequence described with reference to FIG. 4.

Figure 10:
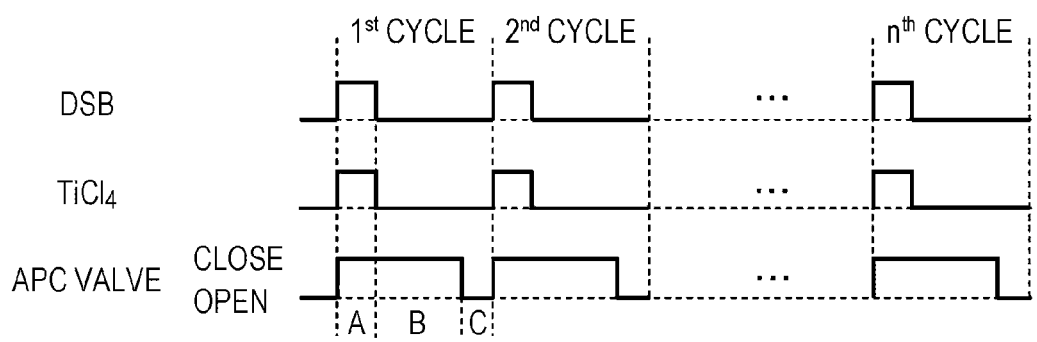
FIG. 10 is a diagram illustrating modification 8 of the film-forming sequence of the embodiment of the present invention.

FIG. 10 illustrates an example in which $TiCl_4$ gas being titanium halide precursor gas is used as the halogen-based precursor gas. According to the present modification illustrated in FIG. 10, as the film containing Si as the first element and Ti as the second element, it is possible to form a titanium silicide film to which C is added in a slight amount, that is, a C-containing TiSi film (C-doped TiSi film), on the wafer 200. In addition, even in the present modification, the same effect as the above-described embodiment can be obtained.

In a case where $ZrCl_4$ gas, $HfCl_4$ gas, $NbCl_5$ gas, $TaCl_5$ gas, $MoCl_5$ gas, $WCl_6$ gas, or $AlCl_3$ gas is used as the halogen-based precursor, it is possible to form a metal silicide film containing Si as the first element and at least one metal element selected from the group consisting of Zr, Hf, Nb, Ta, Mo, W, and Al as the second element. That is, a ZrSi film, an HfSi film, a NbSi film, a TaSi film, a MoSi film, a WSi film, and an AlSi film can be formed on the wafer 200. These films are C-containing metal silicide films (C-doped films) to which C is added in a slight amount. Even in the present modification, the same effect as the above-described embodiment can be obtained.

(Modifications 9 to 13)

Modification 8 and modifications 1 to 7 can be arbitrarily combined with one another. The processing procedures and processing conditions of the combined cases can be the same processing procedures and processing conditions as the film-forming sequence described with reference to FIG. 4 or modifications 1 to 8.

For example, $O_2$ gas may be supplied in step B or the like by using the DSB gas the hydro-based precursor gas and the $TiCl_4$ gas as the halogen-based precursor gas. In this case, as the film containing Ti, Si, and O, it is possible to form a titanium silicide oxide film to which C is added in a slight amount, that is, a C-containing TiSiO film (C-doped TiSiO film) (modification 9), on the wafer 200. Even in the present modification, the same effect as the above-described embodiment can be obtained.

In addition, for example, $NH_3$ gas and $O_2$ gas may be supplied in step B or the like by using the DSB gas the hydro-based precursor gas and the $TiCl_4$ gas as the halogen-based precursor gas. In this case, as the film containing Ti, Si, O, and N, it is possible to form a titanium silicide oxynitride film to which C is added in a slight amount, that is, a C-containing TiSiON film (C-doped TiSiON film) on the wafer 200 (modification 10). Even in the present modification, the same effect as the above-described embodiment can be obtained.

In addition, for example, $BCl_3$ gas and $NH_3$ gas may be supplied in step B or the like by using the DSB gas the hydro-based precursor gas and the $TiCl_4$ gas as the halogen-based precursor gas. In this case, as the film containing Ti, Si, B, and N, it is possible to form a titanium silicide boride nitride film to which C is added in a slight amount, that is, a C-containing TiSiBN film (C-doped TiSiBN film) on the wafer 200 (modification 11). Even in the present modification, the same effect as the above-described embodiment can be obtained.

For example, $NH_3$ gas may be supplied in step B or the like by using the DSB gas the hydro-based precursor gas and the $TiCl_4$ gas as the halogen-based precursor gas. In this case, as the film containing Ti, Si, and N, it is possible to form a titanium silicide nitride film to which C is added in a slight amount, that is, a C-containing TiSiN film (C-doped TiSiN film) (modification 12) on the wafer 200. Even in the present modification, the same effect as the above-described embodiment can be obtained.

In addition, for example, $SiH_4$ gas may be used as the hydro-based precursor gas, and $TiCl_4$ gas may be used as the halogen-based precursor gas. In this case, as the film containing Ti and Si, it is possible to form a C-free TiSi film (non-doped TiSi film) to which C is not added, that is, a C-containing TiSiO film (C-doped TiSiO film) on the wafer 200 (modification 13). Even in the present modification, the same effect as the above-described embodiment can be obtained.

Other Embodiments of Present Invention

Although the embodiments of the present invention have been described, the present invention is not limited to the embodiments.

For example, in the above-described embodiment, in a case where the DSB gas alone is supplied into the process chamber 201, the example in which the temperature of the wafer 200 is set in the film-forming process (steps A to C) such that the temperature of the wafer 200 becomes a temperature at which the DSB is not thermally decomposed, or a temperature at which the DSB is hardly decomposed has been described. However, the present disclosure is not limited to the above-described embodiment.

That is, in the film-forming process (steps A to C), the temperature of the wafer 200 may be set to a temperature at which the DSB is thermally decomposed, or a temperature at which the DSB is easily decomposed, for example, a temperature of a range of higher than 450° C. to equal to or lower than 500° C., when the DSB gas alone is supplied into the process chamber 201. Even in the case, the same effect as the above-described embodiment can be obtained. In addition, since the deposition temperature is high, the deposition rate of the C-containing Si film can be improved.

In addition, for example, the present invention can also be preferably applied to the case where the C-free inorganic precursor is used as the hydro-based precursor and the C-containing organic precursor is used as the halogen-based precursor. In addition, the present invention can also be preferably applied to the case where the C-containing organic precursor is used as each of the hydro-based precursor and the halogen-based precursor. That is, the present invention can also be preferably applied to the case where the precursor of at least one selected from the group consisting of the hydro-based precursor and the halogen-based precursor is the C-containing organic precursor, or the case where both are the C-free inorganic precursors as in the above-described modification 6.

In addition, for example, in the above-described embodiment, the example in which the communication part 270 is provided above the portion included in the region horizontally surrounding the wafer arrangement region of the inner tube 203b, specifically the upper end part 203c of the inner tube 203b has been described. The present invention is not limited to the above-described embodiment. That is, as described above, the communication part 270 may be provided above the wafer arrangement region in the sidewall part of the inner tube 203b and in the vicinity of the upper end part 203c. In addition, for example, as illustrated in FIG. 13, the communication part 270 may be provided under the portion included in the region horizontally surrounding the wafer arrangement region in the sidewall part of the inner tube 203b and the portion included in the region horizontally surrounding the heat insulation plate arrangement region.

When the communication part 270 is provided in the portion included in the region horizontally surrounding the wafer arrangement region of the inner tube 203b, the distance until the active species generated between the outer tube 203a and the inner tube 203b reaches the wafer 200 is shortened, and thus, the active species easily contacts the wafer 200. As a result, the film thickness and film quality uniformity is easily degraded in the wafer in-plane and inter-plane of the thin film formed on the wafer 200. That is, the in-plane average film thickness of the thin film formed on the wafer 200 in the vicinity of the communication part 270 easily becomes thicker than the in-plane average thickness of the thin film formed on the wafer 200 spaced apart from the communication part 270. In addition, the in-plane film thickness uniformity of the thin film formed on the wafer 200 in the vicinity of the communication part 270 is degraded more than the in-plane thickness uniformity of the thin film formed on the wafer 200 spaced apart from the communication part 270.

Figure 13:
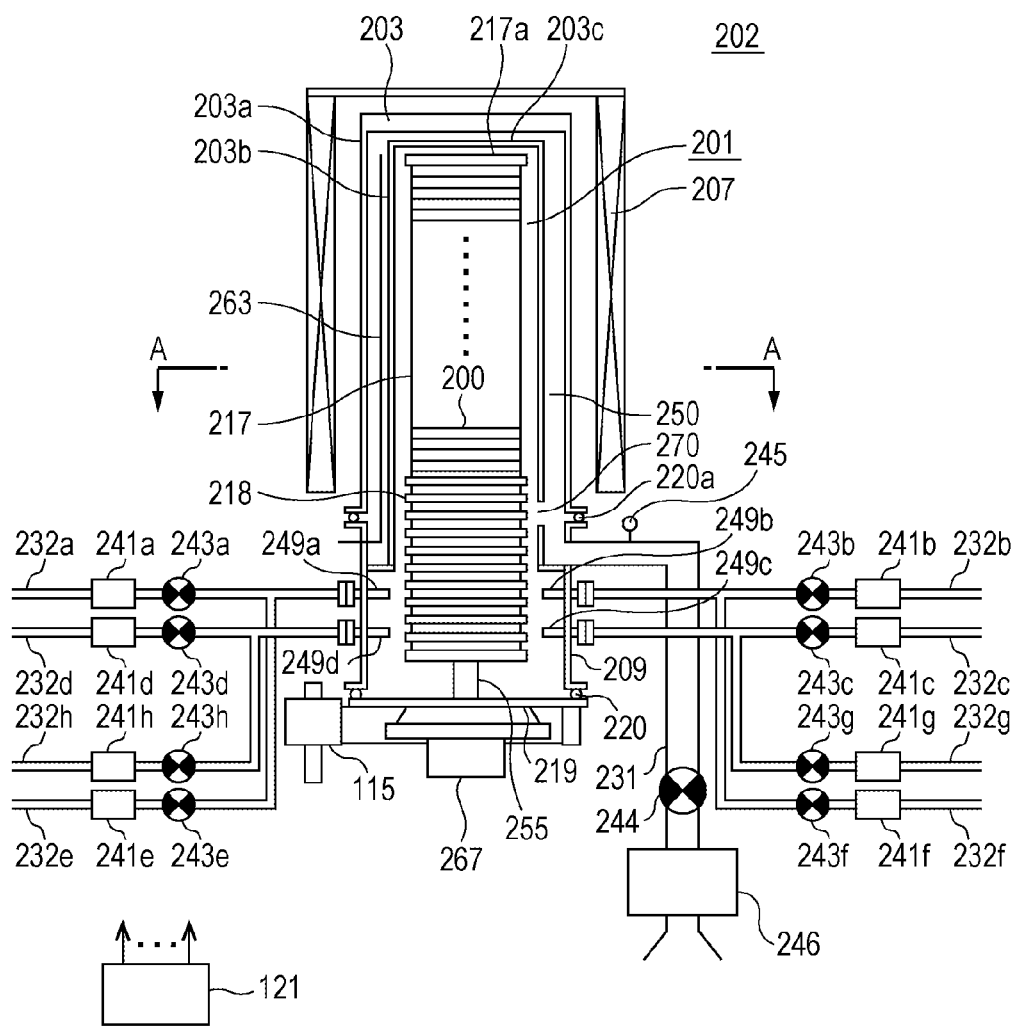
FIG. 13 is a diagram illustrating another example of a configuration of an inner tube of an embodiment of the present invention.

In contrast, as illustrated in FIG. 1 or 13, when the communication part 270 is provided above or under the portion included in the region horizontally surrounding the wafer arrangement region of the inner tube 203b, it is possible to extend the distance until the active species generated between the outer tube 203a and the inner tube 203b reaches the wafer 200, and it is possible to suppress the active species from contacting the wafer 200. As a result, it is possible to improve the uniformity of the film thickness and the film quality in the wafer in-plane and inter-plane of the thin film formed on the wafer 200.

It is preferable that (a plurality of) process recipes used in the above-described film-forming process of various thin films (program in which processing sequence or processing condition is described) are separately prepared according to the contents of the substrate processing (type of a film to be formed, a composition ratio, film quality, film thickness, processing sequence, processing condition, etc.). It is preferable that, when the substrate processing is started, a suitable recipe is appropriately selected from the plurality of recipes according to the contents of the substrate processing. Specifically, it is preferable that the plurality of recipes separately prepared according to the contents of the substrate processing is previously stored (installed) in the memory device 121c provided in the substrate processing apparatus through the telecommunication line or the non-transitory computer-readable recording medium (external memory device 123) storing the relevant recipe. It is preferable that, when the film-forming process is started, the CPU 121a provided in the substrate processing apparatus appropriately selects a suitable recipe from the plurality of recipes stored in the memory device 121c according to the contents of the substrate processing. Due to such a configuration, films of various film types, composition ratios, film quality, film thickness can be formed for general purposes and with good reproducibility by a single substrate processing substrate. Since the workload of an operator (input/output load of the processing sequence, processing conditions, and the like) can be reduced. Therefore, erroneous operations can be prevented and the substrate processing can be quickly started.

The above-described process recipe is not limited to a case that newly creates a process recipe. For example, the process recipe may be prepared by modifying an existing recipe having been installed on the substrate processing apparatus. When the recipe is modified, the modified recipe may be installed on the substrate processing substrate through the telecommunication line or the non-transitory computer-readable recording medium storing the relevant recipe. Also, an existing recipe having been installed on the substrate processing apparatus may be directly modified by operating the input/output device 122 provided in the existing substrate processing apparatus.

In the above-described embodiments, the example in which the thin film is formed using a batch-type substrate processing apparatus that processes a plurality of sheets of substrates at a time has been described. However, the present invention is not limited to the above-described embodiments. For example, the present invention can be preferably applied to a case in which a thin film is formed using a single-wafer-type substrate processing apparatus that processes a single substrate at a time. Also, in the above-described embodiments, the example in which the thin film is formed using a hot wall type substrate processing apparatus has been described. However, the present invention is not limited to the above-described embodiments. For example, the present invention can be preferably applied to a case in which a thin film is formed using a cold wall type substrate processing apparatus. In these cases, the processing sequence and the processing condition can be the same as, for example, the processing sequence and the processing condition of the above-described embodiment.

Figure 11:
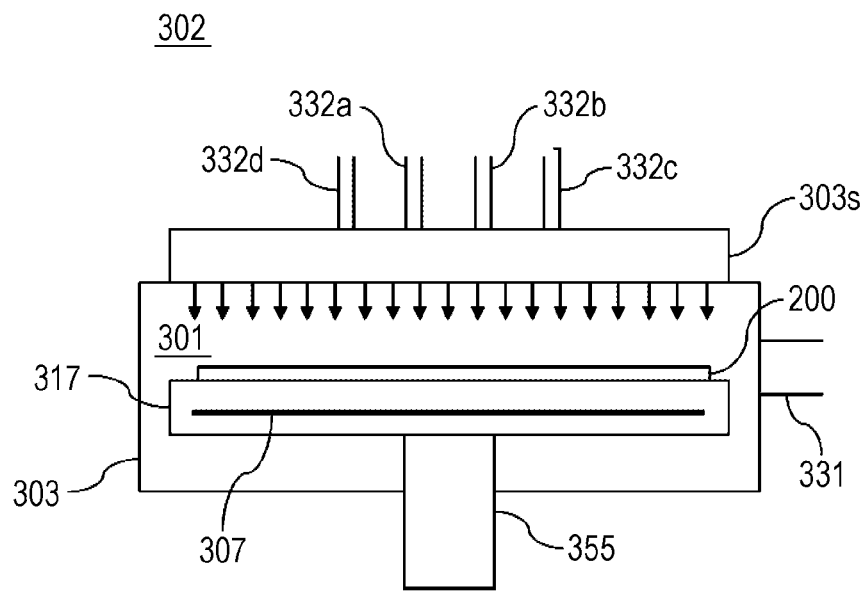
FIG. 11 is a schematic configuration diagram of a vertical process furnace of a substrate processing apparatus suitably used in another embodiment of the present invention and a longitudinal sectional view of a process furnace part.

For example, the present invention can also be preferably applied to a case in which a thin film is formed using a substrate processing apparatus including a process furnace 302 illustrated in FIG. 11. The process furnace 302 includes a process vessel 303 configured to form a process chamber 301, a shower head 303s configured to supply a gas into the process chamber 301 in a shower shape, a support table 317 configured to support one sheet or a plurality of sheets of wafers 200 in a horizontal posture, a rotational shaft 355 configured to support the support table 317 from below, and a heater 307 provided in the support table 317. Gas supply ports 332a to 332d are connected to an inlet (gas inlet) of the shower head 303s. The same precursor supply system as the hydro-based precursor supply system of the above-described embodiment is connected to the gas supply port 332a. The same precursor supply system as the halogen-based precursor gas supply system of the above-described embodiment is connected to the gas supply port 332b. The same gas supply system as the oxygen-containing gas supply system of the above-described embodiment and the same gas supply system as the boron-containing gas supply system of the above-described embodiment are connected to the gas supply port 332c. The same gas supply system as the nitrogen-containing gas supply system of the above-described embodiment is connected to the gas supply port 332d. A gas distribution plate configured to supply a gas into the process chamber 301 in a shower shape is provided in an outlet (gas outlet) of the shower head 303s. In the process vessel 303, an exhaust port 331 is provided to exhaust the process chamber 301. The same exhaust system as the exhaust system of the above-described embodiment is connected to the exhaust port 331.

Figure 12:
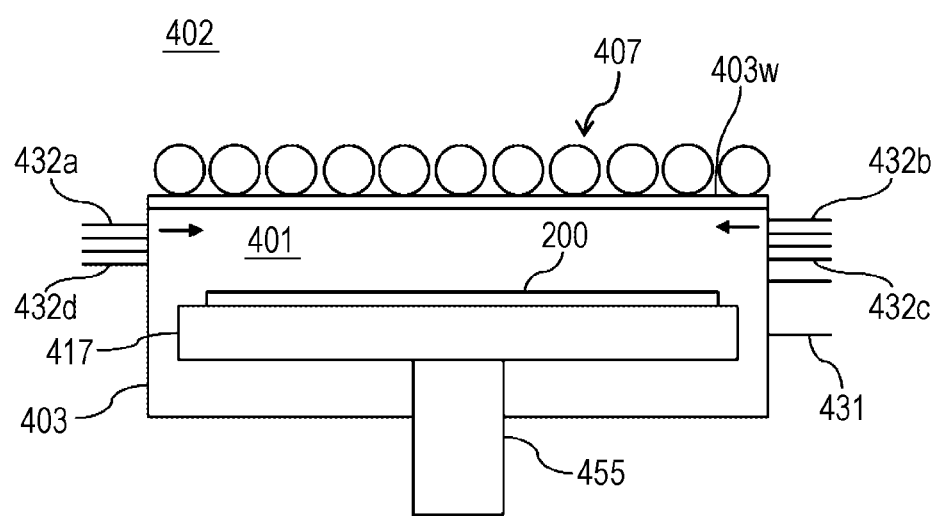
FIG. 12 is a schematic configuration diagram of a vertical process furnace of a substrate processing apparatus suitably used in another embodiment of the present invention and a longitudinal sectional view of a process furnace part.

In addition, for example, the present invention can also be preferably applied to a case in which a thin film is formed using a substrate processing apparatus including a process furnace 402 as illustrated in FIG. 12. The process furnace 402 includes a process vessel 403 configured to form a process chamber 401, a support table 417 configured to support one sheet or a plurality of sheets of wafers 200 in a horizontal posture, a rotational shaft 455 configured to support the support table 417 from below, a lamp heater 407 configured to irradiate the wafers 200 with light in the process vessel 403, and a quartz window 403w configured to transmit the light of the lamp heater 407. Gas supply ports 432a to 432d are connected to the process vessel 403. The same precursor supply system as the hydro-based precursor supply system of the above-described embodiment is connected to the gas supply port 432a. The same precursor supply system as the halogen-based precursor gas supply system of the above-described embodiment is connected to the gas supply port 432b. The same gas supply system as the oxygen-containing gas supply system of the above-described embodiment and the same gas supply system as the boron-containing gas supply system of the above-described embodiment are connected to the gas supply port 432c. The same gas supply system as the nitrogen-containing gas supply system of the above-described embodiment is connected to the gas supply port 432d. In the process vessel 403, an exhaust port 431 is provided to exhaust the process chamber 401. The same exhaust system as the exhaust system of the above-described embodiment is connected to the exhaust port 431.

Even when such a substrate processing apparatus is used, the same sequences and processing conditions as the above-described embodiments and modifications can be performed.

In addition, the above-described embodiments or modifications can be appropriately combined. Also, the processing condition at this time can be the same as, for example, the processing condition of the above-described embodiment.

EXAMPLE

By using the substrate processing apparatus according to the above-described embodiment, a C-containing Si film was formed on a wafer by the film-forming sequence illustrated in FIG. 4. DSB gas was used as the hydro-based precursor gas, and HCDS gas was used as the halogen-based precursor gas. The supply flow rate of the DSB gas was 100 sccm, and the supply time of the DSB gas was 3 seconds. The supply flow rate of the HCDS gas was 2,000 sccm, and the supply time of the HCDS gas was 3 seconds. The deposition temperature was 450° C. The other processing conditions were in the processing condition ranges described in the above embodiments.

Figure 14:
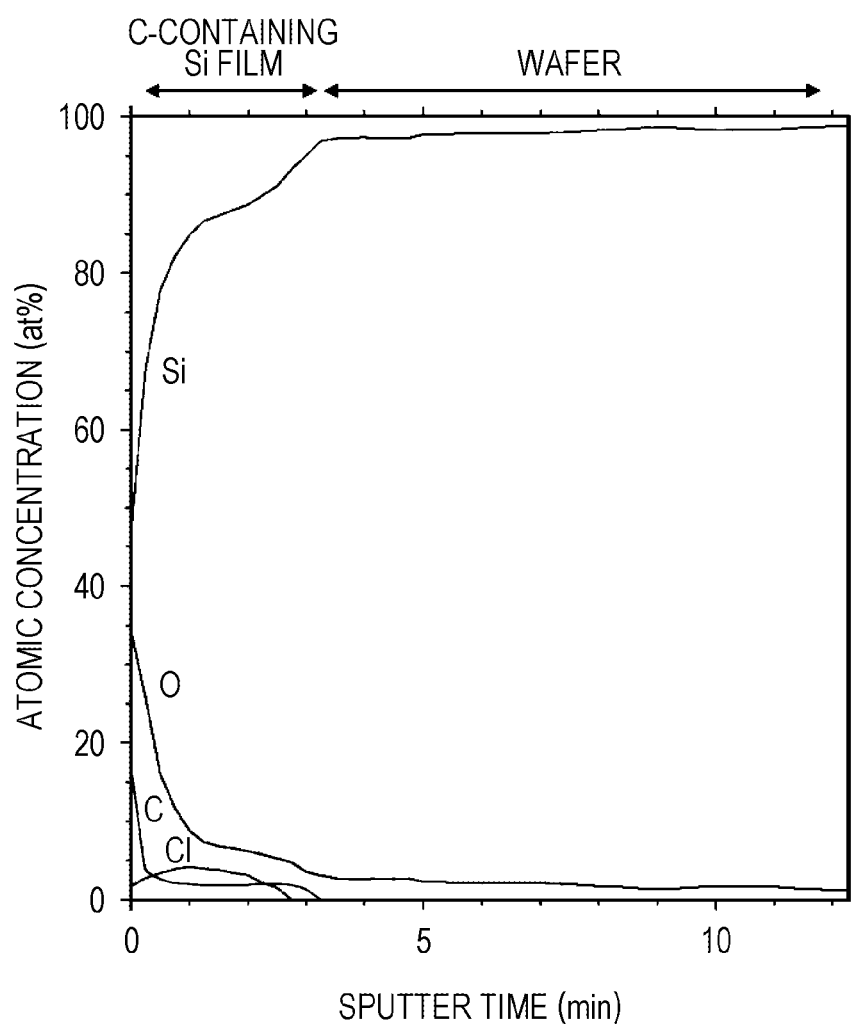
FIG. 14 is a diagram illustrating a composition distribution in a depth direction of a film formed in the embodiment of the present invention.

Ion sputtering for the C-containing Si film and X-ray photoelectron spectroscopy (XPS) analysis were alternately repeated to measure the composition distribution (profile) of the C-containing Si film in the depth direction. FIG. 14 is a diagram illustrating the composition distribution of the C-containing Si film in the depth direction in the present embodiment. A horizontal axis of FIG. 14 represents sputtering time (min) that is equal to the depth of the C-containing Si film from the surface thereof. In addition, a vertical axis of FIG. 14 represents atom concentrations (at %) of Si, C, O, and Cl contained in the C-containing Si film.

It can be seen from FIG. 14 that the C concentration of the C-containing Si film formed in the present embodiment is 2 to 3 at %. That is, by using a plurality of types of precursor gases having different chemical structures, such as the DSB gas and the HCDS gas, in combination, it is possible to improve the controllability of the composition ratio of the film and widen the window of the composition ratio control. Cl illustrated in FIG. 14 represents that Cl included in the HCDS gas remains in the film during the film-forming process. In addition, O illustrated in FIG. 14 represents that, when the wafer in which the C-containing Si film is formed is exposed to the atmosphere, Cl remaining in the film is substituted with water ($H_2O$) or oxygen ($O_2$) in the atmosphere, and is resultantly incorporated in the film. According to other experiments performed by the inventors, it was confirmed that, when the film-forming process illustrated in FIG. 4 was performed under the above-described processing conditions, the C concentration of the C-containing Si film could be controlled to a concentration of a range of, for example, 1 to 10%.

Preferred Aspects of Present Invention

Hereinafter, preferred aspects of the present invention will be additionally described.
(Supplementary Note 1)
According to an aspect of the present invention, there is provided a method of manufacturing a semiconductor device, including forming a film containing a first element and a second element on a substrate by performing a cycle a predetermined number of times, the cycle including: (a) supplying a hydro-based precursor containing the first element and a halogen-based precursor containing the second element into a process chamber accommodating a substrate to confine the hydro-based precursor and the halogen-based precursor in the process chamber; (b) maintaining a state where the hydro-based precursor and the halogen-based precursor are confined in the process chamber; and (c) exhausting the process chamber.
(Supplementary Note 2)
In the method according to Supplementary Note 1, preferably, at least one selected from the group consisting of the hydro-based precursor and the halogen-based precursor contains carbon.
(Supplementary Note 3)
In the method according to Supplementary Note 1 or 2, preferably, the hydro-based precursor contains a chemical bond of the first element and carbon.
(Supplementary Note 4)
In the method according to any of Supplementary Notes 1 to 3, preferably, the hydro-based precursor contains the first element, carbon, and hydrogen.
(Supplementary Note 5)
In the method according to any of Supplementary Notes 1 to 4, preferably, the hydro-based precursor contains a chemical bond of the first element (Si—C bond) and carbon and a chemical bond of the first element and hydrogen (Si—H bond).
(Supplementary Note 6)
In the method according to any of Supplementary Notes 1 to 5, preferably, the hydro-based precursor contains at least one selected from the group consisting of $Si_xC_yH_{2(x+y+1)}$ and $Si_xC_{(y+1)}H_{2(x+y+1)}$ (where each of x and y is an integer of 1 or more).
(Supplementary Note 7)
In the method according to any of Supplementary Notes 1 to 6, preferably, the hydro-based precursor contains at least one selected from the group consisting of $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_4H_{10}$, $Si_2C_3H_{10}$, and $Si_3C_2H_{10}$.
(Supplementary Note 8)
In the method according to Supplementary Note 1 or 2, preferably, the hydro-based precursor contains a chemical bond of the first element and hydrogen (Si—H bond).
(Supplementary Note 9)
In the method according to Supplementary Note 1, 2, or 8, preferably, the hydro-based precursor contains at least one selected from the group consisting of $SiH_2$, $Si_2H_6$, and $Si_3H_8$.
(Supplementary Note 10)
In the method according to any of Supplementary Notes 1 to 9, preferably, the halogen-based precursor is an inorganic precursor.
(Supplementary Note 11)
In the method according to any of Supplementary Notes 1 to 10, preferably, the halogen-based precursor contains at least one selected from the group consisting of a chloro group (Cl), a fluoro group (F), a bromo group (Br), and iodine group (I).
(Supplementary Note 12)
In the method according to any of Supplementary Notes 1 to 11, preferably, the halogen-based precursor is an inorganic halide (carbon-free halide).
(Supplementary Note 13)
In the method according to any of Supplementary Notes 1 to 12, preferably, the halogen-based precursor contains at least one selected from the group consisting of a chemical bond (Si—Cl bond, M-Cl bond) of the second element and chlorine, a chemical bond (Si—F bond, M-F bond) of the second element and fluorine, a chemical bond (Si—Br bond, M-Br bond) of the second element and bromine, and a chemical bond (Si—I bond, M-I bond) of the second element and iodine (M is a metal element).

(Supplementary Note 14)

In the method according to any of Supplementary Notes 1 to 13, preferably, the halogen-based precursor contains at least one selected from the group consisting of $SiH_3Cl$, $SiH_2Cl_2$, $SiHCl_3$, $SiCl_4$, and $Si_2Cl_6$.

(Supplementary Note 15)

In the method according to any of Supplementary Notes 1 to 13, preferably, the halogen-based precursor contains at least one selected from the group consisting of $TiCl_4$, $ZrCl_4$, $HfCl_4$, $TaCl_5$, $NbCl_5$, $MoCl_5$, $WCl_6$, and $AlCl_3$.

(Supplementary Note 16)

In the method according to any of Supplementary Notes 1 to 9, preferably, the halogen-based precursor contains a chemical bond of the second element and carbon.

(Supplementary Note 17)

In the method according to any of Supplementary Notes 1 and 8 to 15, preferably, both the hydro-based precursor and the halogen-based precursor are inorganic precursors (carbon-free precursor).

(Supplementary Note 18)

In the method according to any of Supplementary Notes 1 to 17, preferably, the hydro-based precursor and the halogen-based precursor react with each other by confinement, and the first element contained in the hydro-based precursor and the second element contained in the halogen-based precursor form a chemical bond.

(Supplementary Note 19)

In the method according to any of Supplementary Notes 1 to 18, preferably, the hydro-based precursor and the halogen-based precursor react with each other by confinement, and the first element contained in the hydro-based precursor and the second element contained in the halogen-based precursor form a chemical bond. At this time, due to the reaction between the hydro-based precursor and the halogen-based precursor, a gaseous by-product containing hydrogen halide is generated.

(Supplementary Note 20)

In the method according to any of Supplementary Notes 3 to 16, 18, and 19, preferably, the hydro-based precursor and the halogen-based precursor react with each other by confinement, and the first element contained in the hydro-based precursor and the second element contained in the halogen-based precursor form a chemical bond. At this time, at least a portion of the chemical bond of the first element contained in the hydro-based precursor and carbon is held without being cut.

(Supplementary Note 21)

In the method according to any of Supplementary Notes 1 to 20, preferably, the first element and the second element are the same element.

(Supplementary Note 22)

In the method according to any of Supplementary Notes 1 to 20, preferably, the first element and the second element are different elements.

(Supplementary Note 23)

In the method according to any of Supplementary Notes 1 to 22, preferably, the film containing the first element and the second element contains at least one selected from the group consisting of carbon-containing silicon (carbon-doped silicon), carbon-free silicon (carbon-undoped silicon), and metal silicide.

(Supplementary Note 24)

According to another aspect of the present invention, there is provided a substrate processing apparatus including: a process chamber configured to accommodate a substrate; a hydro-based precursor supply system configured to supply a hydro-based precursor containing a first element into the process chamber; a halogen-based precursor supply system configured to supply a halogen-based precursor containing a second element into the process chamber; an exhaust system configured to exhaust the process chamber; and a controller configured to control the hydro-based precursor supply system, the halogen-based precursor supply system, and the exhaust system such that a film containing the first element and the second element is formed on the substrate by performing a cycle a predetermined number of times, the cycle including: (a) supplying the hydro-based precursor and the halogen-based precursor into the process chamber accommodating a substrate to confine the hydro-based precursor and the halogen-based precursor in the process chamber; (b) maintaining a state where the hydro-based precursor and the halogen-based precursor are confined in the process chamber; and (c) exhausting the process chamber.

(Supplementary Note 25)

According to further another aspect of the present invention, there is provided is a non-transitory computer-readable recording medium storing a program that causes a computer to perform a process of forming a film containing a first element and a second element on a substrate by performing a cycle a predetermined number of times, the cycle including: (a) supplying a hydro-based precursor containing the first element and a halogen-based precursor containing the second element into a process chamber accommodating a substrate to confine the hydro-based precursor and the halogen-based precursor in the process chamber; (b) maintaining a state where the hydro-based precursor and the halogen-based precursor are confined in the process chamber; and (c) exhausting the process chamber.

What is claimed is:

1. A method of manufacturing a semiconductor device, comprising forming a film containing silicon and carbon on a substrate by performing a cycle a predetermined number of times, the cycle including:
   (a) supplying a hydro-based precursor containing silicon and a halogen-based precursor containing silicon into a process chamber accommodating a substrate to confine the hydro-based precursor and the halogen-based precursor in the process chamber, the hydro-based precursor further containing a chain skeleton in which carbon atoms are bonded to one another in a chain shape;
   (b) maintaining a state where the hydro-based precursor and the halogen-based precursor are confined in the process chamber in a state where the supplying of the hydro-based precursor and the halogen-based precursor into the process chamber is stopped; and
   (c) exhausting the process chamber through an exhaust system including a valve,
   wherein the valve is fully closed in (a) and (b), and
   a supply flow rate and a supply time of each of the hydro-based precursor and the halogen-based precursor in (a) are controlled such that a ratio of an amount of the hydro-based precursor with respect to an amount of the halogen-based precursor in the process chamber in (b) ranges from 1/8 to 1 such that carbon concentration in the film ranges from 2% to 10%.

2. The method according to claim 1, wherein the hydro-based precursor contains a chemical bond of silicon and carbon.

3. The method according to claim 1, wherein the hydro-based precursor contains silicon, carbon, and hydrogen.

4. The method according to claim 1, wherein the hydro-based precursor contains a chemical bond of silicon and carbon and a chemical bond of silicon and hydrogen.

5. The method according to claim 1, wherein the hydro-based precursor contains at least one selected from the group consisting of $Si_xC_yH_{2(x+y+1)}$ and $Si_xC_{(y+1)}H_{2(x+y+1)}$ (where each of x and y is an integer of 1 or more).

6. The method according to claim 1, wherein the hydro-based precursor contains at least one selected from the group consisting of $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$, and $Si_3C_2H_{10}$.

7. The method according to claim 1, wherein the hydro-based precursor contains a chemical bond of silicon and hydrogen.

8. The method according to claim 1, wherein the halogen-based precursor is an inorganic precursor.

9. The method according to claim 1, wherein the halogen-based precursor contains at least one selected from the group consisting of a chloro group, a fluoro group, a bromo group, and iodine group.

10. The method according to claim 1, wherein the halogen-based precursor is an inorganic halide.

11. The method according to claim 1, wherein the halogen-based precursor contains at least one selected from the group consisting of a chemical bond of silicon and chlorine, a chemical bond of silicon and fluorine, a chemical bond of the silicon and bromine, and a chemical bond of silicon and iodine.

12. The method according to claim 1, wherein the halogen-based precursor contains at least one selected from the group consisting of $SiH_3Cl$, $SiH_2Cl_2$, $SiHCl_3$, $SiCl_4$, and $Si_2Cl_6$.

13. The method according to claim 1, wherein the halogen-based precursor contains a chemical bond of silicon and carbon.

14. The method according to claim 1, wherein silicon is bonded to at least one of carbon atoms constituting the chain skeleton, hydrogen is bonded to silicon, and hydrogen is bonded to at least one of carbon atoms constituting the chain skeleton in a chemical structure of the hydro-based precursor.

15. The method according to claim 1, wherein the supply flow rate and the supply time of each of the hydro-based precursor and the halogen-based precursor in (a) is controlled such that the ratio of the amount of the hydro-based precursor with respect to the amount of the halogen-based precursor in the process chamber in (b) becomes a range of ⅑ to ¼ such that carbon concentration in the film ranges from 2% to 10%.

16. A non-transitory computer-readable recording medium storing a program that causes a computer to perform a process of forming a film containing silicon and carbon on a substrate by performing a cycle a predetermined number of times, the cycle including:
(a) supplying a hydro-based precursor containing silicon and a halogen-based precursor containing silicon into a process chamber accommodating a substrate to confine the hydro-based precursor and the halogen-based precursor in the process chamber, the hydro-based precursor further containing a chain skeleton in which carbon atoms are bonded to one another in a chain shape;
(b) maintaining a state where the hydro-based precursor and the halogen-based precursor are confined in the process chamber in a state where the supplying of the hydro-based precursor and the halogen-based precursor into the process chamber is stopped; and
(c) exhausting the process chamber through an exhaust system including a valve,
wherein the valve is fully closed in (a) and (b), and
a supply flow rate and a supply time of each of the hydro-based precursor and the halogen-based precursor in (a) are controlled such that a ratio of an amount of the hydro-based precursor with respect to an amount of the halogen-based precursor in the process chamber in (b) ranges from ⅑ to 1 such that carbon concentration in the film ranges from 2% to 10%.

17. A method of manufacturing a semiconductor device, comprising forming a film containing silicon and carbon on a substrate by performing a cycle a predetermined number of times, the cycle including:
(a) supplying a hydro-based precursor containing silicon and a halogen-based precursor containing silicon into a process chamber accommodating a substrate to confine the hydro-based precursor and the halogen-based precursor in the process chamber, the hydro-based precursor further containing a chain skeleton in which carbon atoms are bonded to one another in a chain shape, silicon being bonded to at least one of carbon atoms constituting the chain skeleton, hydrogen being bonded to silicon, and hydrogen being bonded to at least one of carbon atoms constituting the chain skeleton in a chemical structure of the hydro-based precursor;
(b) maintaining a state where the hydro-based precursor and the halogen-based precursor are confined in the process chamber in a state where the supplying of the hydro-based precursor and the halogen-based precursor into the process chamber is stopped; and
(c) exhausting the process chamber through an exhaust system including valve,
wherein the valve is fully closed in (a) and (b), and
a supply flow rate and a supply time of each of the hydro-based precursor and the halogen-based precursor in (a) are controlled such that a ratio of an amount of the hydro-based precursor with respect to an amount of the halogen-based precursor in the process chamber in (b) ranges from ⅑ to 1 such that carbon concentration in the film ranges from 2% to 10%.

18. The method according to claim 17, wherein the supply flow rate and the supply time of each of the hydro-based precursor and the halogen-based precursor in (a) is controlled such that the ratio of the amount of the hydro-based precursor with respect to the amount of the halogen-based precursor in the process chamber in (b) becomes a range of ⅑ to ¼ such that carbon concentration in the film ranges from 2% to 10%.

* * * * *